(12) United States Patent
Honda et al.

(10) Patent No.: US 9,087,908 B2
(45) Date of Patent: *Jul. 21, 2015

(54) SEMICONDUCTOR DEVICE

(71) Applicant: Semiconductor Energy Laboratory Co., Ltd., Atsugi-shi, Kanagawa-ken (JP)

(72) Inventors: Tatsuya Honda, Setagaya (JP); Masashi Tsubuku, Atsugi (JP); Yusuke Nonaka, Atsugi (JP); Takashi Shimazu, Nagoya (JP); Shunpei Yamazaki, Setagaya (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/255,124

(22) Filed: Apr. 17, 2014

(65) Prior Publication Data

US 2014/0225109 A1    Aug. 14, 2014

Related U.S. Application Data

(63) Continuation of application No. 13/649,580, filed on Oct. 11, 2012, now Pat. No. 8,729,613.

(30) Foreign Application Priority Data

Oct. 14, 2011   (JP) .................. 2011-227022

(51) Int. Cl.
   *H01L 31/062* (2012.01)
   *H01L 29/786* (2006.01)

(52) U.S. Cl.
   CPC ...... *H01L 29/78693* (2013.01); *H01L 29/7869* (2013.01)

(58) Field of Classification Search
   CPC .............. H01L 27/14609; H01L 27/14643; H01L 27/14603; H01L 27/14689; H01L 27/1463
   USPC .......................... 257/43, 59, 72, 291
   See application file for complete search history.

(56) References Cited

U.S. PATENT DOCUMENTS 5,731,856 A    3/1998   Kim et al.
5,744,864 A    4/1998   Cillessen et al.
(Continued)

FOREIGN PATENT DOCUMENTS

CN    101794820    8/2010
CN    101796644    8/2010
(Continued)

OTHER PUBLICATIONS

Kamiya et al., "Carrier Transport Properties and Electronic Structures of Amorphous Oxide Semiconductors: the present status," Solid State Physics, Sep. 1, 2009, vol. 44, No. 9, pp. 621-633, Agne Gijutsu Center.

(Continued)

*Primary Examiner* — Quoc Hoang
(74) *Attorney, Agent, or Firm* — Eric J. Robinson; Robinson Intellectual Property Law Office, P.C.

(57) ABSTRACT

The concentration of impurity elements included in an oxide semiconductor film in the vicinity of a gate insulating film is reduced. Further, crystallinity of the oxide semiconductor film in the vicinity of the gate insulating film is improved. A semiconductor device includes an oxide semiconductor film over a substrate, a source electrode and a drain electrode over the oxide semiconductor film, a gate insulating film which includes an oxide containing silicon and is formed over the oxide semiconductor film, and a gate electrode over the gate insulating film. The oxide semiconductor film includes a region in which the concentration of silicon is lower than or equal to 1.0 at. %, and at least the region includes a crystal portion.

20 Claims, 18 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 7,791,072 B2 | 9/2010 | Kumomi et al. |
| 7,923,722 B2 * | 4/2011 | Ryu et al. .................. 257/43 |
| 8,158,976 B2 | 4/2012 | Son et al. |
| 8,188,471 B2 | 5/2012 | Iwasaki et al. |
| 8,237,166 B2 | 8/2012 | Kumomi et al. |
| 8,314,032 B2 | 11/2012 | Kawamura et al. |
| 8,384,076 B2 | 2/2013 | Park et al. |
| 8,395,931 B2 | 3/2013 | Yamazaki et al. |
| 8,399,882 B2 | 3/2013 | Jeon et al. |
| 8,445,902 B2 | 5/2013 | Sato et al. |
| 8,481,377 B2 | 7/2013 | Akimoto et al. |
| 8,513,661 B2 | 8/2013 | Takahashi et al. |
| 8,530,273 B2 | 9/2013 | Boer |
| 8,618,537 B2 | 12/2013 | Kaneko et al. |
| 8,624,240 B2 | 1/2014 | Sato et al. |
| 8,729,613 B2 * | 5/2014 | Honda et al. ................ 257/291 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0051109 A1 | 3/2004 | Ishizaki et al. |
| 2004/0127038 A1 | 7/2004 | Carcia et al. |
| 2005/0017302 A1 | 1/2005 | Hoffman |
| 2005/0084610 A1 | 4/2005 | Selitser |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0072469 A1 | 3/2010 | Yamazaki et al. |
| 2010/0092800 A1 | 4/2010 | Itagaki et al. |
| 2010/0109002 A1 | 5/2010 | Itagaki et al. |
| 2010/0181565 A1 | 7/2010 | Sakata et al. |
| 2010/0187523 A1 | 7/2010 | Sakata et al. |
| 2010/0219410 A1 | 9/2010 | Godo et al. |
| 2010/0258794 A1 | 10/2010 | Iwasaki et al. |
| 2011/0140098 A1 | 6/2011 | Akimoto et al. |
| 2011/0147738 A1 | 6/2011 | Yamazaki et al. |
| 2011/0182110 A1 | 7/2011 | Yamazaki et al. |
| 2011/0193081 A1 | 8/2011 | Godo et al. |
| 2011/0204355 A1 | 8/2011 | Suzuki et al. |
| 2011/0204362 A1 | 8/2011 | Akimoto et al. |
| 2011/0233763 A1 | 9/2011 | Pendse et al. |
| 2012/0001167 A1 | 1/2012 | Morosawa |
| 2012/0242627 A1 | 9/2012 | Kim et al. |
| 2013/0037793 A1 | 2/2013 | Pan et al. |
| 2013/0082262 A1 | 4/2013 | Honda et al. |
| 2013/0082263 A1 | 4/2013 | Honda et al. |
| 2013/0092944 A1 | 4/2013 | Honda et al. |
| 2013/0127694 A1 | 5/2013 | Kim et al. |
| 2013/0187154 A1 | 7/2013 | Uchiyama et al. |
| 2013/0309808 A1 | 11/2013 | Zhang et al. |

FOREIGN PATENT DOCUMENTS

| | | |
|---|---|---|
| EP | 1 737 044 A | 12/2006 |
| EP | 2 226 847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 | 5/1999 |
| JP | 2000-044236 A | 2/2000 |
| JP | 2000-150900 A | 5/2000 |
| JP | 2002-076356 A | 3/2002 |
| JP | 2002-289859 A | 10/2002 |
| JP | 2003-086000 A | 3/2003 |
| JP | 2003-086808 A | 3/2003 |

(56) References Cited

FOREIGN PATENT DOCUMENTS

| | | |
|---|---|---|
| JP | 2004-103957 A | 4/2004 |
| JP | 2004-273614 A | 9/2004 |
| JP | 2004-273732 A | 9/2004 |
| JP | 2006-165528 A | 6/2006 |
| JP | 2008-311342 A | 12/2008 |
| JP | 2009-081413 A | 4/2009 |
| JP | 2010-186994 A | 8/2010 |
| JP | 2011-096884 A | 5/2011 |
| JP | 2011-142315 A | 7/2011 |
| JP | 2011-205017 A | 10/2011 |
| KR | 2010-0061511 A | 6/2010 |
| KR | 2010-0084466 A | 7/2010 |
| WO | WO 2004/114391 | 12/2004 |
| WO | WO 2009/031634 | 3/2009 |
| WO | WO 2011/070887 | 6/2011 |

OTHER PUBLICATIONS

Fortunato et al., "Wide-Bandgap High-Mobility ZNO Thin-Film Transistors Produced at Room Temperature," Appl. Phys. Lett. (Applied Physics Letters), Sep. 27, 2004, vol. 85, No. 13, pp. 2541-2543.

Dembo et al., "RFCPUS on Glass and Plastic Substrates Fabricated by TFT Transfer Technology," IEDM 05: Technical Digest of International Electron Devices Meeting, Dec. 5, 2005, pp. 1067-1069.

Ikeda et al., "Full-Functional System Liquid Crystal Display Using CG-Silicon Technology," SID Digest '04: SID International Symposium Digest of Technical Papers, 2004, vol. 35, pp. 860-863.

Nomura et al., "Room-Temperature Fabrication of Transparent Flexible Thin-Film Transistors Using Amorphous Oxide Semiconductors," Nature, Nov. 25, 2004, vol. 432, pp. 488-492.

Park et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Takahashi et al., "Theoretical Analysis of IGZO Transparent Amorphous Oxide Semiconductor," IDW '08: Proceedings of the 15th International Display Workshops, Dec. 3, 2008, pp. 1637-1640.

Hayashi et al., "42.1: Invited Paper: Improved Amorphous In—Ga—Zn—O TFTs," SID Digest '08: SID International Symposium Digest of Technical Papers, May 20, 2008, vol. 39, pp. 621-624.

Prins et al., "A Ferroelectric Transparent Thin-Film Transistor," Appl. Phys. Lett. (Applied Physics Letters), Jun. 17, 1996, vol. 68, No. 25, pp. 3650-3652.

Nakamura et al., "The Phase Relations in the $In_2O_3$—$Ga_2ZnO_4$—ZnO System at 1350° C.," Journal of Solid State Chemistry, Aug. 1, 1991, vol. 93, No. 2, pp. 298-315.

Kimizuka et al., "Syntheses and Single-Crystal Data of Homologous Compounds, $In_2O_3(ZnO)_m$ (m=3, 4, and 5), $InGaO_3(ZnO)_3$, and $Ga_2O_3(ZnO)_m$ (m=7, 8, 9, and 16) in the $In_2O_3$—$ZnGa_2O_4$—ZnO System," Journal of Solid State Chemistry, Apr. 1, 1995, vol. 116, No. 1, pp. 170-178.

Nomura et al., "Thin-Film Transistor Fabricated in Single-Crystalline Transparent Oxide Semiconductor," Science, May 23, 2003, vol. 300, No. 5623, pp. 1269-1272.

Masuda et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Asakuma et al., "Crystallization and Reduction of Sol-Gel-Derived Zinc Oxide Films by Irradiation with Ultraviolet Lamp," Journal of Sol-Gel Science and Technology, 2003, vol. 26, pp. 181-184.

Osada et al., "15.2: Development of Driver-Integrated Panel using Amorphous In—Ga—Zn—Oxide TFT," SID Digest '09: SID International Symposium Digest of Technical Papers, May 31, 2009, pp. 184-187.

Nomura et al., "Carrier transport in transparent oxide semiconductor with intrinsic structural randomness probed using single-crystalline $InGaO_3(ZnO)_5$ films," Appl. Phys. Lett. (Applied Physics Letters), Sep. 13, 2004, vol. 85, No. 11, pp. 1993-1995.

Li et al., "Modulated Structures of Homologous Compounds $InMO_3(ZnO)_m$ (M=In,Ga; m=Integer) Described by Four-Dimensional Superspace Group," Journal of Solid State Chemistry, 1998, vol. 139, pp. 347-355.

Son et al., "42.4L: Late-News Paper: 4 Inch QVGA AMOLED Driven by the Threshold Voltage Controlled Amorphous GIZO ($Ga_2O_3$—$In_2O_3$—ZnO) TFT," SID Digest '08: SID International Symposium Digest of Technical Papers, May 20, 2008, vol. 39, pp. 633-636.

Lee et al., "World's Largest (15-inch) XGA AMLCD Panel Using IGZO Oxide TFT," SID Digest '08: SID International Symposium Digest of Technical Papers, May 20, 2008, vol. 39, pp. 625-628.

Nowatari et al., "60.2: Intermediate Connector with Suppressed Voltage Loss for White Tandem OLEDs," SID Digest '09: SID International Symposium Digest of Technical Papers, May 31, 2009, vol. 40, pp. 899-902.

Kanno et al., "White Stacked Electrophosphorecent Organic Light-Emitting Devices Employing $MoO_3$ as a Charge-Generation Layer," Adv. Mater. (Advanced Materials), 2006, vol. 18, No. 3, pp. 339-342.

Tsuda et al., "Ultra Low Power Consumption Technologies for Mobile TFT-LCDs," IDW '02: Proceedings of the 9$^{th}$ International Display Workshops, Dec. 4, 2002, pp. 295-298.

Van de Walle, "Hydrogen as a Cause of Doping in Zinc Oxide," Phys. Rev. Lett. (Physical Review Letters), Jul. 31, 2000, vol. 85, No. 5, pp. 1012-1015.

Fung et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Jeong et al., "3.1: Distinguished Paper: 12.1-Inch WXGA AMOLED Display Driven by Indium—Gallium—Zinc Oxide TFTs Array," SID Digest '08: SID International Symposium Digest of Technical Papers, May 20, 2008, vol. 39, No. 1, pp. 1-4.

Park et al., "High performance amorphous oxide thin film transistors with self-aligned top-gate structure," IEDM 09: Technical Digest of International Electron Devices Meeting, Dec. 7, 2009, pp. 191-194.

Kurokawa et al., "UHF RFCPUs on Flexible and Glass Substrates for Secure RFID Systems," Journal of Solid-State Circuits, 2008, vol. 43, No. 1, pp. 292-299.

Ohara et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Coates et al., "Optical Studies of the Amorphous Liquid-Cholesteric Liquid Crystal Transition: The "Blue Phase"," Physics Letters, Sep. 10, 1973, vol. 45A, No. 2, pp. 115-116.

Cho et al., "21.2: Al and Sn-doped Zinc Indium Oxide Thin Film Transistors for AMOLED Back-Plane," SID Digest '09: SID International Symposium Digest of Technical Papers, May 31, 2009, pp. 280-283.

Lee et al., "15.4: Excellent Performance of Indium—Oxide-Based Thin-Film Transistors by DC Sputtering," SID Digest '09: SID International Symposium Digest of Technical Papers, May 31, 2009, pp. 191-193.

Jin et al., "65.2: Distinguished Paper: World-Largest (6.5") Flexible Full Color Top Emission AMOLED Display on Plastic Film and Its Bending Properties," SID Digest '09: SID International Symposium Digest of Technical Papers, May 31, 2009, pp. 983-985.

Sakata et al., "Development of 4.0-In. AMOLED Display with Driver Circuit Using Amorphous In—Ga—Zn—Oxide TFTs," IDW '09: Proceedings of the 16$^{th}$ International Display Workshops, 2009, pp. 689-692.

Park et al., "Amorphous Indium—Gallium—Zinc Oxide TFTs and their Application for Large Size AMOLED," AM-FPD '08 Digest of Technical Papers, Jul. 2, 2008, pp. 275-278.

Park et al., "Challenge to Future Displays: Transparent AM-OLED Driven by PEALD Grown ZnO TFT," IMID '07 Digest, 2007, pp. 1249-1252.

Godo et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

(56) References Cited

OTHER PUBLICATIONS

Osada et al., "Development of Driver-Integrated Panel using Amorphous In—Ga—Zn—Oxide TFT," AM-FPD '09 Digest of Technical Papers, Jul. 1, 2009, pp. 33-36.

Hirao et al., "Novel Top-Gate Zinc Oxide Thin-Film Transistors (ZnO TFTs) for AMLCDs," Journal of the SID, 2007, vol. 15, No. 1, pp. 17-22.

Hosono, "68.3: Invited Paper: Transparent Amorphous Oxide Semiconductors for High Performance TFT," SID Digest '07: SID International Symposium Digest of Technical Papers, 2007, vol. 38, pp. 1830-1833.

Godo et al., "P-9: Numerical Analysis on Temperature Dependence of Characteristics of Amorphous In—Ga—Zn—Oxide TFT," SID Digest '09: SID International Symposium Digest of Technical Papers, May 31, 2009, pp. 1110-1112.

Ohara et al., "21.3: 4.0 In. QVGA AMOLED Display Using In—Ga—Zn—Oxide TFTs with a Novel Passivation Layer," SID Digest '09: SID International Symposium Digest of Technical Papers, May 31, 2009, pp. 284-287.

Miyasaka, "Suftla Flexible Microelectronics on their Way to Business," SID Digest '07: SID International Symposium Digest of Technical Papers, 2007, vol. 38, pp. 1673-1676.

Chern et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Kikuchi et al., "39.1: Invited Paper: Optically Isotropic Nano-Structured Liquid Crystal Composites for Display Applications," SID Digest '09: SID International Symposium Digest of Technical Papers, May 31, 2009, pp. 578-581.

Asaoka et al., "29.1: Polarizer-Free Reflective LCD Combined With Ultra Low-Power Driving Technology," SID Digest '09: SID International Symposium Digest of Technical Papers, May 31, 2009, pp. 395-398.

Lee et al., "Current Status of, Challenges to, and Perspective View of AM-OLED," IDW '06: Proceedings of the 13$^{th}$ International Display Workshops, Dec. 7, 2006, pp. 663-666.

Kikuchi et al., "62.2: Invited Paper: Fast Electro-Optical Switching in Polymer-Stabilized Liquid Crystalline Blue Phases for Display Application," SID Digest '07: SID International Symposium Digest of Technical Papers, 2007, vol. 38, pp. 1737-1740.

Nakamura, "Synthesis of Homologous Compound with New Long-Period Structure," NIRIM Newsletter, Mar. 1, 1995, vol. 150, pp. 1-4.

Kikuchi et al., "Polymer-Stabilized Liquid Crystal Blue Phases," Nature Materials, Sep. 2, 2002, vol. 1, pp. 64-68.

Kimizuka et al., "Spinel, $YbFe_2O_4$, and $Yb_2Fe_3O_7$ Types of Structures for Compounds in the $In_2O_3$ and $Sc_2O_3$—$A_2O_3$—BO Systems [A: Fe, Ga, or Al; B: Mg, Mn, Fe, Ni, Cu, or Zn] at Temperatures Over 1000° C.," Journal of Solid State Chemistry, 1985, vol. 60, pp. 382-384.

Kitzerow et al., "Observation of Blue Phases in Chiral Networks," Liquid Crystals, 1993, vol. 14, No. 3, pp. 911-916.

Costello et al., "Electron Microscopy of a Cholesteric Liquid Crystal and its Blue Phase," Phys. Rev. A (Physical Review A), May 1, 1984, vol. 29, No. 5, pp. 2957-2959.

Meiboom et al., "Theory of the Blue Phase of Cholesteric Liquid Crystals," Phys. Rev. Lett. (Physical Review Letters), May 4, 1981, vol. 46, No. 18, pp. 1216-1219.

Park et al., "42.3: Transparent ZnO Thin Film Transistor for the Application of High Aperture Ratio Bottom Emission AM-OLED Display," SID Digest '08: SID International Symposium Digest of Technical Papers, May 20, 2008, vol. 39, pp. 629-632.

Orita et al., "Mechanism of Electrical Conductivity of Transparent $InGaZnO_4$," Phys. Rev. B (Physical Review B), Jan. 15, 2000, vol. 61, No. 3, pp. 1811-1816.

Nomura et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Janotti et al., "Native Point Defects in ZnO," Phys. Rev. B (Physical Review. B), Oct. 4, 2007, vol. 76, No. 16, pp. 165202-1-165202-22.

Park et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Hsieh et al., "P-29: Modeling of Amorphous Oxide Semiconductor Thin Film Transistors and Subgap Density of States," SID Digest '08: SID International Symposium Digest of Technical Papers, 2008, vol. 39, pp. 1277-1280.

Janotti et al., "Oxygen Vacancies in ZnO," Appl. Phys. Lett. (Applied Physics Letters), 2005, vol. 87, pp. 122102-1-122102-3.

Oba et al., "Defect energetics in ZnO: A hybrid Hartree-Fock density functional study," Phys. Rev. B (Physical Review B), 2008, vol. 77, pp. 245202-1-245202-6.

Orita et al., "Amorphous transparent conductive oxide $InGaO_3(ZnO)_m$ (m<4): a Zn 4s conductor," Philosophical Magazine, 2001, vol. 81, No. 5, pp. 501-515.

Hosono et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Mo et al., "Amorphous Oxide TFT Backplanes for Large Size AMOLED Displays," IDW '08: Proceedings of the 6$^{th}$ International Display Workshops, Dec. 3, 2008, pp. 581-584.

Kim et al., "High-Performance oxide thin film transistors passivated by various gas plasmas," 214$^{th}$ ECS Meeting, 2008, No. 2317, ECS.

Clark et al., "First Principles Methods Using CASTEP," Zeitschrift fur Kristallographie, 2005, vol. 220, pp. 567-570.

Lany et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Park et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Oh et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ueno et al., "Field-Effect Transistor on $SrTiO_3$ with Sputtered $Al_2O_3$ Gate Insulator," Appl. Phys. Lett. (Applied Physics Letters), Sep. 1, 2003, vol. 83, No. 9, pp. 1755-1757.

International Search Report (Application No. PCT/JP2012/076563) dated Nov. 13, 2012.

Written Opinion (Application No. PCT/JP2012/076563) dated Nov. 13, 2012.

* cited by examiner

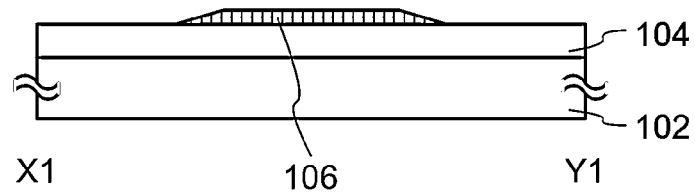
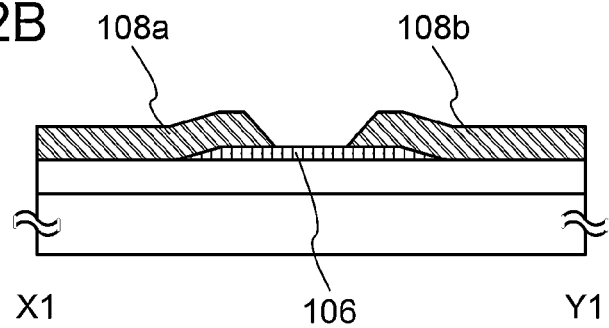
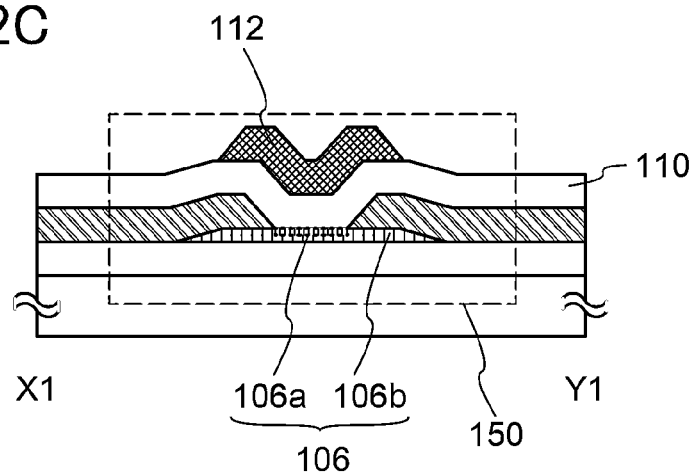
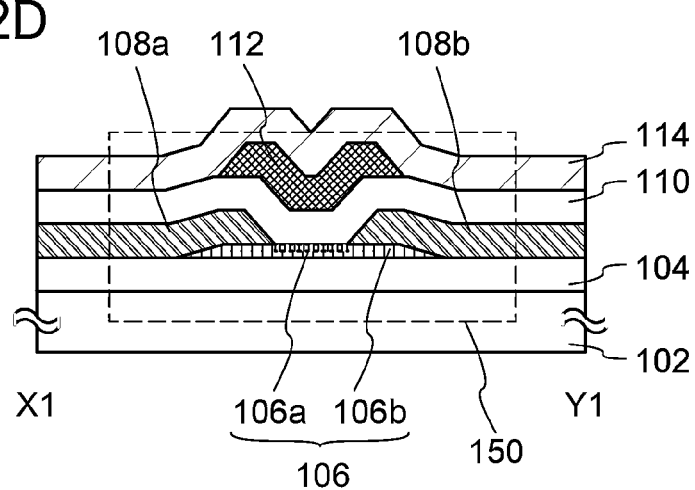

SEMICONDUCTOR DEVICE

TECHNICAL FIELD

The present invention relates to a semiconductor device and a method for manufacturing the semiconductor device.

In this specification, a semiconductor device generally means a device which can function by utilizing semiconductor characteristics, and an electrooptic device, a semiconductor circuit, and an electronic device are all semiconductor devices.

BACKGROUND ART

A technique for forming transistors using a semiconductor thin film formed over a substrate having an insulating surface has attracted attention. The transistor is applied to a wide range of electronic devices such as an integrated circuit (IC) or an image display device (display device). As a semiconductor thin film applicable to the transistor, a silicon based semiconductor material is widely known for example; moreover, an oxide semiconductor has been attracting attention as another material.

For example, a transistor whose active layer includes an amorphous oxide including indium (In), gallium (Ga), and zinc (Zn) is disclosed (see Patent Document 1).

Transistors including oxide semiconductors have on-state characteristics (on-state current) superior to those of transistors including amorphous silicon. In order to apply the transistors including oxide semiconductors to high-performance devices, such transistors are required to have further improved characteristics, and thus techniques of crystallization of oxide semiconductors have been developed (see Patent Document 2). In Patent Document 2, a technique in which an oxide semiconductor is crystallized by heat treatment is disclosed.

REFERENCE

Patent Document

[Patent Document 1] Japanese Published Patent Application No. 2006-165528
[Patent Document 2] Japanese Published Patent Application No. 2008-311342

DISCLOSURE OF INVENTION

In the case where a top-gate transistor including an oxide semiconductor film is formed, a gate insulating film is formed over the oxide semiconductor film. When the gate insulating film is formed, a constituent element of the gate insulating film may enter the oxide semiconductor film over which the gate insulating film is formed.

For example, in the case where a silicon oxide ($SiO_x$, x=2 or more) film is formed as a gate insulating film by a sputtering method after an oxide semiconductor film is formed, silicon that is a constituent element of the silicon oxide and a rare gas element such as argon used for sputtering are together implanted into the oxide semiconductor film. Such silicon breaks a bond between constituent elements of the oxide semiconductor film (an indium atom and an oxygen atom (In—O bond)) and is included as an impurity element in the oxide semiconductor film. The impurity element may be included at a high concentration particularly in the vicinity of the interface between the oxide semiconductor film and the gate insulating film. In the vicinity of the interface between the oxide semiconductor film and the gate insulating film, a channel formation region is formed; thus, when an impurity element such as silicon is included, the resistance of the oxide semiconductor film is increased. As a result, the on-state current which is one of electric characteristics of a transistor is decreased. As described above, the impurity element left in the oxide semiconductor film becomes a cause which affects electric characteristics of the transistor.

Further, in the case where the oxide semiconductor film includes a crystal portion, by entry of the constituent element of the gate insulating film into the oxide semiconductor film, a bond in the crystal portion of the oxide semiconductor film is broken, and accordingly, amorphous regions are more formed in the oxide semiconductor film in the vicinity of the gate insulating film.

In view of the above problems, an object is to reduce the concentration of an impurity element included in an oxide semiconductor film in the vicinity of a gate insulating film. Another object is to improve crystallinity of the oxide semiconductor film in the vicinity of the gate insulating film. Further, another object is to provide a semiconductor device with stable electric characteristics by using the oxide semiconductor film.

One embodiment of the present invention to be disclosed is a semiconductor device including a base insulating film, an oxide semiconductor film formed over the base insulating film, a source electrode and a drain electrode formed over the oxide semiconductor film, a gate insulating film which includes an oxide containing silicon and is formed over the oxide semiconductor film, the source electrode and the drain electrode, and a gate electrode provided to be in contact with the gate insulating film and overlap with at least the oxide semiconductor film. The oxide semiconductor film includes a region in which a concentration of silicon distributed from an interface with the gate insulating film toward an inside of the oxide semiconductor film is lower than or equal to 1.0 at. %, and at least the region includes a crystal portion.

Another embodiment of the present invention to be disclosed is a semiconductor device including a base insulating film, an oxide semiconductor film formed over the base insulating film, a gate insulating film which includes an oxide containing silicon and is formed over the oxide semiconductor film, a gate electrode provided to be in contact with the gate insulating film and overlap with at least the oxide semiconductor film, an interlayer insulating film formed over the gate insulating film and the gate electrode, and a source electrode and a drain electrode provided over the interlayer insulating film to be electrically connected to at least the oxide semiconductor film. The oxide semiconductor film includes a region in which a concentration of silicon distributed from an interface with the gate insulating film toward an inside of the oxide semiconductor film is lower than or equal to 1.0 at. %, and at least the region includes a crystal portion.

In each of the above structures, the region is preferably formed to be in contact with the gate insulating film and have a thickness less than or equal to 5 nm. In addition, the oxide semiconductor film other than the region preferably includes a crystal portion. In the crystal portion, c-axes are preferably aligned in a direction perpendicular to the interface between the base insulating film and the oxide semiconductor film.

Further, in each of the above structures, the region preferably has a silicon concentration lower than or equal to 0.1 at. %. In addition, the region preferably has a carbon concentration lower than or equal to $1.0 \times 10^{20}$ atoms/cm$^3$.

When the oxide semiconductor film in the vicinity of the gate insulating film has the above silicon concentration or the above carbon concentration, an increase in resistance of the oxide semiconductor film can be suppressed and crystallinity of the oxide semiconductor film can be improved. As a result, a semiconductor device with stable electric characteristics can be provided.

According to one embodiment of the present invention to be disclosed, the concentration of an impurity element included in the oxide semiconductor film in the vicinity of the gate insulating film can be decreased. In addition, crystallinity of the oxide semiconductor film in the vicinity of the gate insulating film can be improved. Further, a semiconductor device with stable electric characteristics can be provided.

BRIEF DESCRIPTION OF DRAWINGS

FIGS. 2A to 2D are cross-sectional views illustrating an example of a manufacturing process of a semiconductor device.

BEST MODE FOR CARRYING OUT THE INVENTION

Figure 1A:
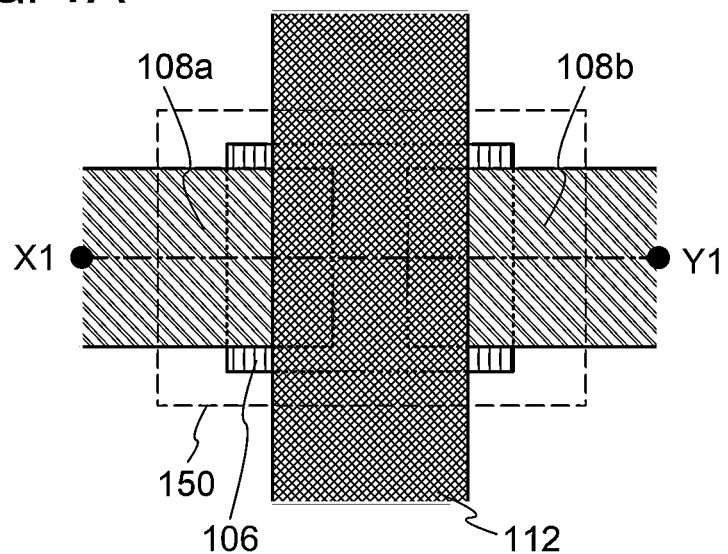
FIGS. 1A and 1B are a plan view and a cross-sectional view illustrating one embodiment of a semiconductor device.

Hereinafter, embodiments of the invention disclosed in this specification will be described with reference to the accompanying drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not limit the components numerically.

Note that in this specification and the like, the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be replaced with each other in this specification and the like.

Note that in this specification and the like, the term "electrically connected" includes the case where components are connected through an object having any electric function. There is no particular limitation on an object having any electric function as long as electric signals can be transmitted and received between components that are connected through the object. Examples of an "object having any electric function" are a switching element such as a transistor, a resistor, an inductor, a capacitor, and an element with a variety of functions as well as an electrode and a wiring.

Embodiment 1

In this embodiment, one embodiment of a semiconductor device and one embodiment of a method for manufacturing the semiconductor device will be described with reference to FIGS. 1A and 1B and FIGS. 2A to 2D.

<Example of Structure of Semiconductor Device>

Figure 1B:
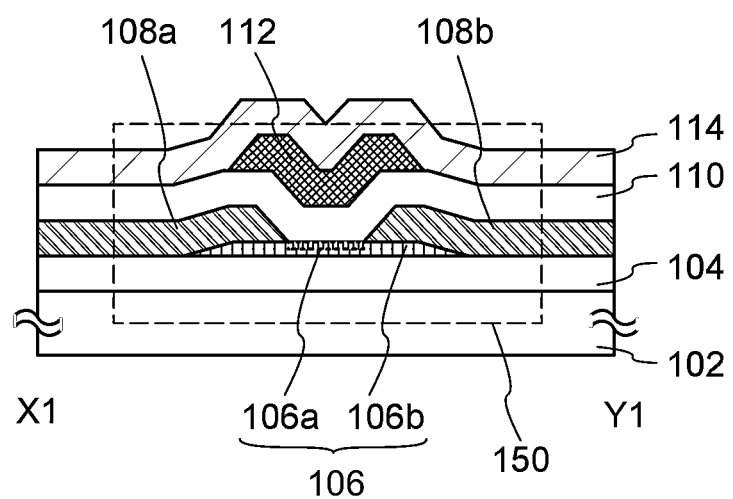

As an example of a semiconductor device, a top-gate transistor is illustrated in FIGS. 1A and 1B. FIG. 1A is a plan view and FIG. 1B is a cross-sectional view taken along dashed line X1-Y1 in FIG. 1A. Note that in FIG. 1A, some components of a transistor 150 (e.g., a gate insulating film 110) are omitted for simplicity.

The transistor 150 illustrated in FIGS. 1A and 1B includes, over a substrate 102, a base insulating film 104, an oxide semiconductor film 106 which is formed over the base insulating film 104 and includes a region 106a and a region 106b, a source electrode 108a and a drain electrode 108b formed over the base insulating film 104 and the oxide semiconductor film 106, the gate insulating film 110 formed over the oxide semiconductor film 106 and the source electrode 108a and the drain electrode 108b, and a gate electrode 112 provided to be in contact with the gate insulating film 110 and overlap with at least the oxide semiconductor film 106. In addition, an interlayer insulating film 114 is formed over the transistor 150.

The thickness of the oxide semiconductor film 106 is greater than 5 nm and less than or equal to 200 nm, preferably greater than or equal to 10 nm and less than or equal to 30 nm.

Further, the oxide semiconductor film 106 preferably has a structure with crystallinity (e.g., a single crystal structure, a microcrystalline structure, or the like).

As illustrated in FIG. 1B, an end portion of the oxide semiconductor film 106 is preferably tapered at an angle of 20° to 50°. When the oxide semiconductor film 106 has a perpendicular end portion, oxygen is more likely to be released from the end portion of the oxide semiconductor film 106, and accordingly, oxygen vacancies are likely to be generated. When the oxide semiconductor film 106 has a tapered end portion, generation of oxygen vacancies is suppressed, and thus generation of leakage current of the transistor 150 can be reduced.

In this embodiment, the oxide semiconductor film 106 is preferably a c-axis aligned crystalline oxide semiconductor (CAAC-OS) film. Note that the CAAC-OS film will be described in detail later in a manufacturing method of the transistor 150.

For the gate insulating film 110, an oxide containing silicon, which has a sufficient withstand voltage and sufficient insulating properties, is preferably used. In the case where the gate insulating film 110 has a single-layer structure, an insulating film such as a silicon oxide film may be used, for example.

Alternatively, the gate insulating film 110 may have a stacked structure. In the case where the gate insulating film 110 has a stacked structure, an oxide containing silicon may be stacked over a gallium oxide, an aluminum oxide, a silicon nitride, a silicon oxynitride, an aluminum oxynitride, a yttrium oxide, a lanthanum oxide, a silicon nitride oxide, or the like. Alternatively, an oxide containing silicon may be stacked over a high-k material such as hafnium oxide, hafnium silicate ($HfSi_xO_y$ (x>0, y>0)), hafnium silicate to which nitrogen is added ($HfSiO_xN_y$ (x>0, y>0)), or hafnium aluminate ($HfAl_xO_y$ (x>0, y>0)).

In the case of using an oxide containing silicon as the gate insulating film 110, part of contained oxygen can be released from the insulating film when the insulating film is heated; thus, oxygen can be supplied to the oxide semiconductor film 106, and oxygen vacancies in the oxide semiconductor film 106 can be filled. In particular, the gate insulating film 110 preferably contains a large amount of oxygen which exceeds at least the stoichiometry thereof. For example, a film of silicon oxide represented by the formula $SiO_{2\alpha}$ ($\alpha$>0) is preferably used as the gate insulating film 110. When such a silicon oxide film is used as the gate insulating film 110, oxygen can be supplied to the oxide semiconductor film 106, so that the transistor 150 using the oxide semiconductor film 106 can have favorable transistor characteristics.

However, in the case of using a silicon oxide film as the gate insulating film 110, silicon that is a constituent element of the gate insulating film 110 might be taken as an impurity into the oxide semiconductor film 106. Silicon or the like which is a constituent element of the gate insulating film 110 enters the oxide semiconductor film 106 and serves as an impurity, which affects characteristics of the transistor.

Further, in the case where the oxide semiconductor film 106 is a CAAC-OS film, silicon or the like, which is a constituent element of the gate insulating film 110, enters the oxide semiconductor film 106, and a bond in the crystal portion in the oxide semiconductor film 106 is broken. Thus, amorphous regions are more formed in the oxide semiconductor film 106 in the vicinity of the gate insulating film 110.

In particular, impurities such as silicon are likely to enter the oxide semiconductor film 106 in the vicinity of the gate insulating film 110. A channel formation region of the transistor 150 is formed in the oxide semiconductor film 106 in the vicinity of the interface with the gate insulating film 110; thus, when impurities such as silicon enter the vicinity of the interface between the oxide semiconductor film 106 and the gate insulating film 110, characteristics of the transistor 150 might be changed.

Change in structure of the oxide semiconductor film 106 when $SiO_2$, oxide containing silicon, is added as an impurity was examined by classical molecular dynamics calculation. The results thereof are described with reference to FIGS. 12A and 12B, FIGS. 13A and 13B, and FIG. 14. Note that simulation software "SCIGRESS ME" manufactured by Fujitsu Limited was used for classical molecular dynamics calculation. An empirical potential which characterizes the interaction between atoms is defined in the classical molecular dynamics method, so that force that acts on each atom is estimated. Newton's equation of motion is numerically solved, whereby motion (time-dependent change) of each atom can be deterministically tracked.

Hereinafter, calculation models and calculation conditions are described. Note that in this calculation, the Born-Mayer-Huggins potential was used.

A single crystal structure of $InGaZnO_4$ including 1680 atoms (see FIG. 12A) and a structure of $InGaZnO_4$ including 1680 atoms in which 20 atoms of each of In, Ga, and Zn are substituted by silicon (Si) atoms (see FIG. 12B) were formed as calculation models. In the model of silicon (Si) substitution shown in FIG. 12B, silicon atoms are included at 3.57 at. % (2.34 wt. %). Further, the density of the model of the single crystal shown in FIG. 12A is 6.36 g/cm$^3$, and the density of the model of Si substitution shown in FIG. 12B is 6.08 g/cm$^3$.

Figure 12A:
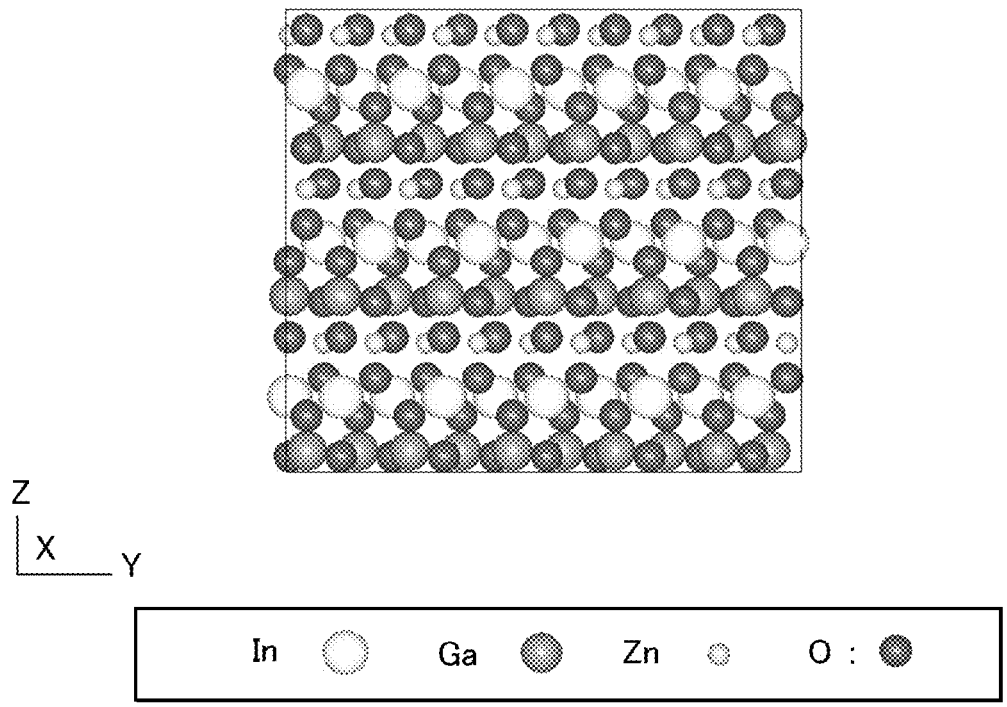
FIGS. 12A and 12B are model diagrams used for calculation.
Figure 12B:
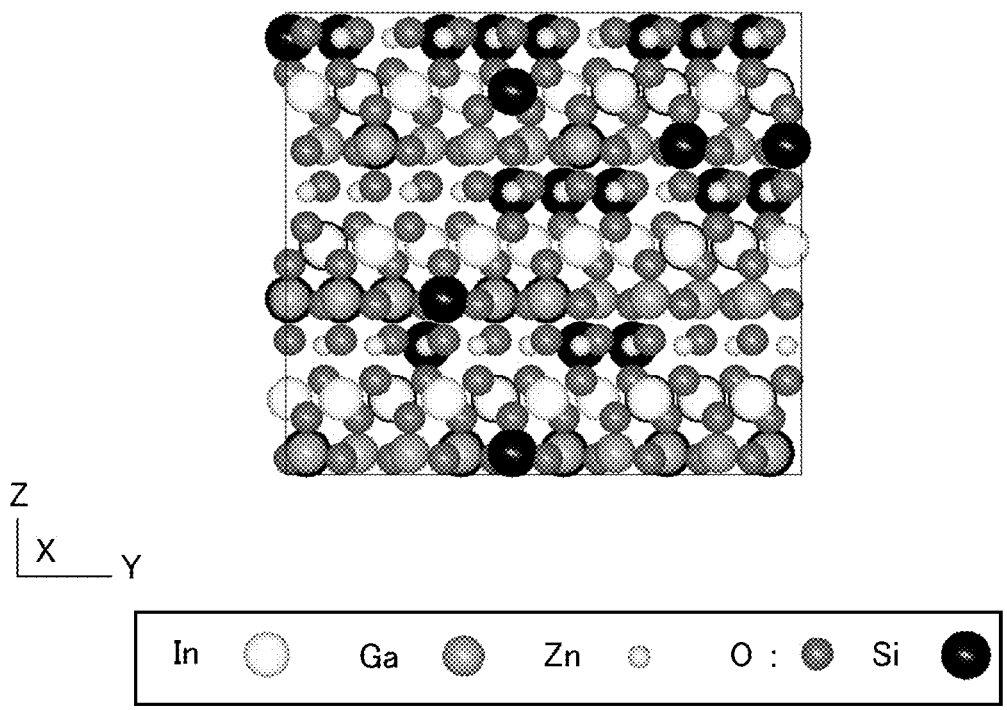

At 1727° C. which is lower than the melting point of the $InGaZnO_4$ single crystal (about 2000° C. according to estimation by the classical molecular dynamics calculation), structure relaxation was performed on the calculation models shown in FIGS. 12A and 12B by the classical molecular dynamics calculation at a fixed pressure (1 atom) for 150 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) becomes closer to 1.

Figure 13A:
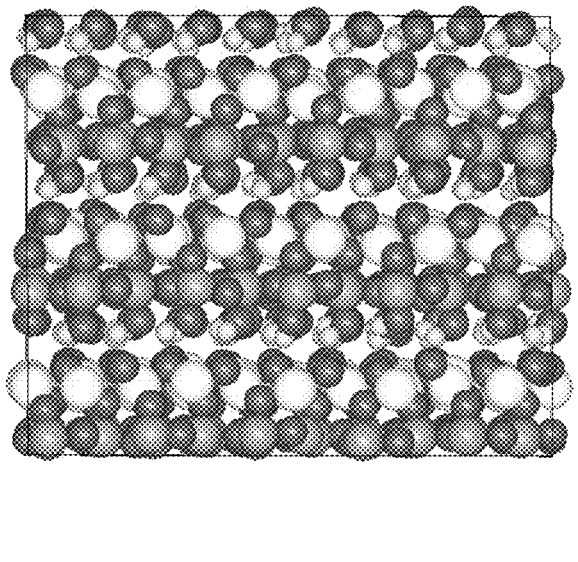
FIGS. 13A and 13B are model diagrams used for calculation.
Figure 13B:
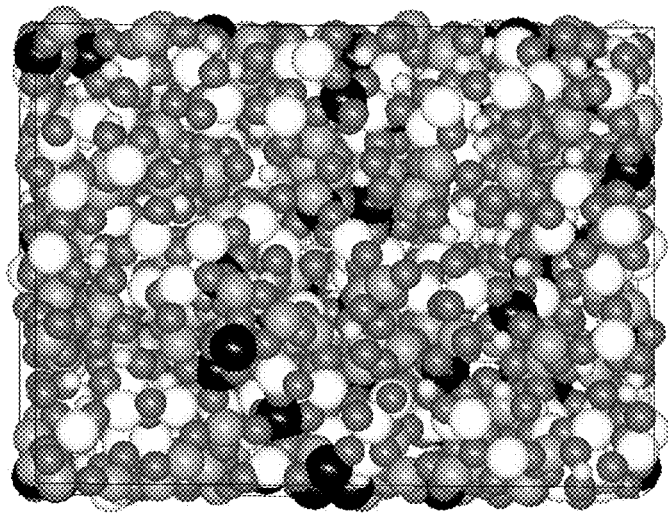
Figure 14:
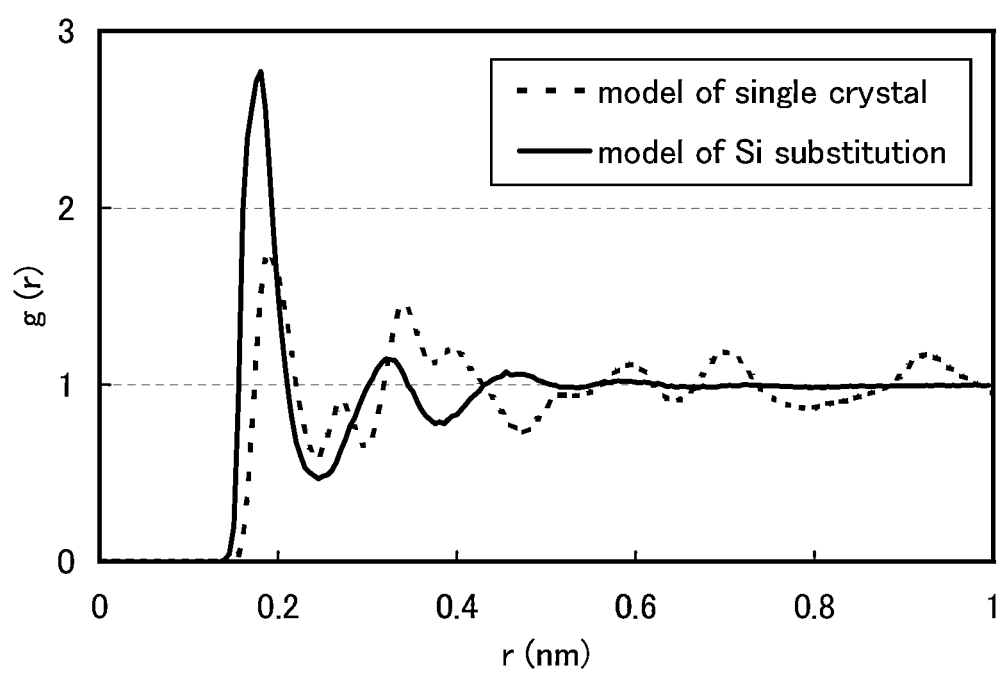
FIG. 14 shows calculation results.

FIGS. 13A and 13B show final structures obtained by performing the classical molecular dynamics calculation for 150 psec on the above two calculation models. In addition, FIG. 14 shows the radial distribution function g(r) in each structure.

The model of single crystal shown in FIG. 13A is stable and keeps the crystal structure even in the final structure, whereas the model of Si substitution shown in FIG. 13B is unstable, and it can be observed that the crystal structure is distorted with time and changes into an amorphous structure. When the radial distribution functions g(r) of the structural models are compared with each other in FIG. 14, it is found that the single crystal model has peaks even at a long distance and has a long-range order. On the other hand, it is found that in the model of Si substitution, the peak disappears at a distance about 0.6 nm, and the model of Si substitution does not have the long-range order.

The above calculation results indicate that when silicon (Si) is included in $InGaZnO_4$, $InGaZnO_4$ is likely to become amorphous. Further, according to the above results, even when $InGaZnO_4$ including silicon (Si) is heated at high temperature, such $InGaZnO_4$ is not crystallized.

Next, change in structure of the oxide semiconductor film 106 when carbon atoms (C) are added was examined by classical molecular dynamics calculation. The results thereof are described with reference to FIG. 12A, FIGS. 15A and 15B, and FIG. 16. Note that simulation software "SCIGRESS ME" manufactured by Fujitsu Limited was used for classical molecular dynamics calculation.

Calculation models and calculation conditions are as follows. Note that in this calculation, the Born-Mayer-Huggins potential was used. Further, for the interaction between carbon atoms (C), a Lennard-Jones potential was used.

A single crystal structure of $InGaZnO_4$ including 1680 atoms (see FIG. 12A) and a structure of $InGaZnO_4$ including 1680 atoms in which 20 atoms of each of In, Ga, and Zn are substituted by carbon atoms (C) and 80 atoms of oxygen (O) are substituted by carbon atoms (C) (see FIG. 15A) were formed as calculation models. In the model of C substitution shown in FIG. 15A, carbon atoms (C) are included at 8.33 at. %. Further, the density of the model of the single crystal shown in FIG. 12A is 6.36 $g/cm^3$, and the density of the model of C substitution shown in FIG. 15A is 5.89 $g/cm^3$.

Figure 15A:
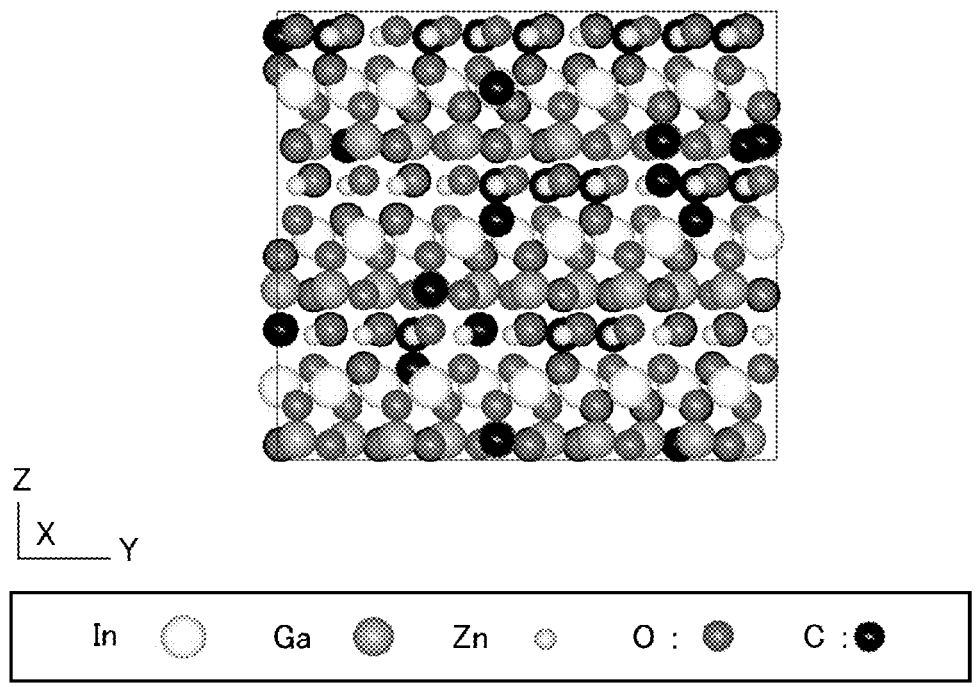
FIGS. 15A and 15B are model diagrams used for calculation.

At 1727° C. which is lower than the melting point of the $InGaZnO_4$ single crystal (about 2000° C. according to estimation by the classical molecular dynamics calculation), structure relaxation was performed on the calculation models shown in FIG. 12A and FIG. 15A by the classical molecular dynamics calculation at a fixed pressure (1 atom) for 150 psec (time step width 0.2 fsec×750000 steps). The radial distribution functions g(r) of the two structures were calculated. Note that the radial distribution function g(r) is a function representing the probability density of atoms existing at a distance of r from one atom. As the correlation between atoms disappears, g(r) becomes closer to 1.

Figure 15B:
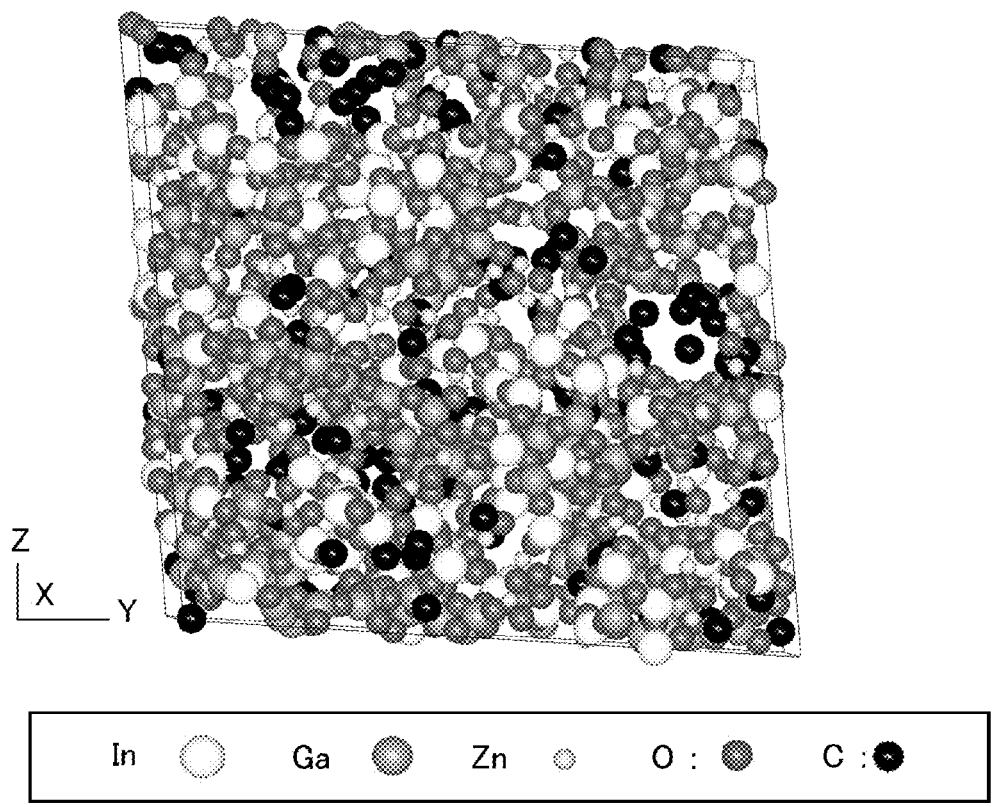
Figure 16:
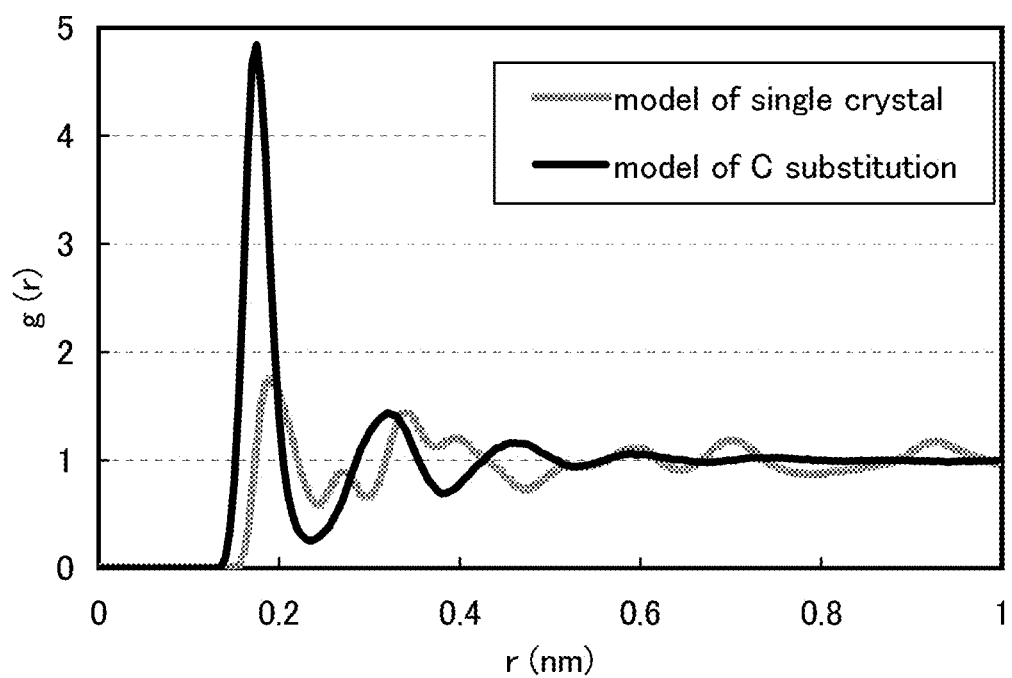
FIG. 16 shows calculation results.

FIG. 13A and FIG. 15B show final structures obtained by performing the classical molecular dynamics calculation for 150 psec on the above two calculation models. The radial distribution function g(r) in each structure is shown in FIG. 16.

The model of single crystal shown in FIG. 13A is stable and keeps the crystal structure even in the final structure, whereas the model of C substitution shown in FIG. 15B is unstable, and it can be observed that the crystal structure is distorted with time and changes into an amorphous structure. As seen in FIG. 16, by comparing the radial distribution functions g(r) of the structural models with each other, it is found that the model of single crystal has peaks even at a long distance and the long-range order. On the other hand, it is found that in the model of C substitution, the peak disappears at a distance about 0.7 nm, and the model of C substitution does not have the long-range order.

The above calculation results indicate that when carbon (C) is included in $InGaZnO_4$, $InGaZnO_4$ is likely to become amorphous. In addition, according to the above results, even when $InGaZnO_4$ including carbon (C) is heated at high temperature, such $InGaZnO_4$ is not crystallized.

Thus, in the semiconductor device described in this embodiment, entry of impurities such as silicon into the oxide semiconductor film 106 in the vicinity of the interface with the gate insulating film 110 is suppressed. As a result, in the oxide semiconductor film 106, a region in which the concentration of silicon distributed from an interface with the gate insulating film 110 toward an inside of the oxide semiconductor film 106 is lower than or equal to 1.0 at. % is formed. Such a region is referred to as a region 106a as illustrated in FIG. 1B. The concentration of silicon included in the region 106a is further preferably lower than or equal to 0.1 at. %. Further, the region 106a is provided to be in contact with the gate insulating film 110 and have a thickness less than or equal to 5 nm.

Note that as shown in FIG. 1B, a region in the oxide semiconductor film 106 other than the region 106a is referred to as a region 106b.

Further, in the case where impurities such as carbon is included in the gate insulating film 110, such impurities might also enter the oxide semiconductor film 106 and serve as impurities, as in the case of silicon. In that case, the concentration of carbon included in the region 106a is lower than or equal to $1.0 \times 10^{20}$ atoms/$cm^3$, preferably lower than or equal to $1.0 \times 10^{19}$ atoms/$cm^3$.

In order to prevent impurities such as silicon from entering the oxide semiconductor film 106, the gate insulating film may be formed in such a manner as not to damage the oxide semiconductor film 106. For example, in the case where a silicon oxide film is formed as the gate insulating film 110 by a sputtering method, the impact caused by silicon (that is a constituent element of the gate insulating film 110) colliding with the oxide semiconductor film 106 may be reduced. For achieving the above, specifically, a method in which the power for deposition of the gate insulating film 110 is low, a method in which the pressure for deposition of the gate insulating film 110 is high, a method in which a distance between a target and a substrate (T-S distance) is increased in deposition of the gate insulating film 110, or the like can be used. However, a formation method of the gate insulating film 110 is not limited to the above. For example, a silicon oxide film, a silicon oxynitride film, a silicon nitride oxide film, or the like, which is formed by a PE-CVD method, can be used. A PE-CVD method is preferred to a sputtering method because with use of the PE-CVD method, the oxide semiconductor film 106 serving as a base film is less damaged.

As described above, the concentration of impurities such as silicon and carbon entering the region 106a in the oxide semiconductor film 106 is reduced, whereby change in characteristics of the transistor 150 can be suppressed. Further, in the case where the oxide semiconductor film 106 is a CAAC-OS film, a crystal portion can be formed even in the vicinity with the gate insulating film 110. When the transistor 150 is formed using such an oxide semiconductor film 106, a semiconductor device with stable electric characteristics can be provided.

Note that the details of the other components of the transistor are described with reference to FIGS. 2A to 2D, in description of a method for manufacturing the transistor 150 below.

<Manufacturing Method of Transistor 150>

Hereinafter, an example of a method for manufacturing the transistor 150 illustrated in FIGS. 1A and 1B of this embodiment is described with reference to FIGS. 2A to 2D.

First, the substrate 102 is prepared. Although there is no particular limitation on a substrate that can be used as the substrate 102, it is necessary that the substrate have heat resistance to withstand at least a heat treatment performed later. For example, a glass substrate such as a barium borosilicate glass substrate or an aluminoborosilicate glass substrate, a ceramic substrate, a quartz substrate, a sapphire substrate, or the like can be used. Alternatively, a single crystal semiconductor substrate or a polycrystalline semiconductor substrate made of silicon or silicon carbide, a compound semiconductor substrate made of silicon germanium or the like, an SOI substrate, or the like can be used.

A flexible substrate may be used as the substrate 102. In the case of using a flexible substrate, a transistor including the oxide semiconductor film 106 may be directly formed over the flexible substrate. Alternatively, a transistor including the oxide semiconductor film 106 may be formed over another substrate, and then, the transistor may be separated and transferred to a flexible substrate. For separation of the transistor from the substrate and transfer to the flexible substrate, a separation layer may be provided between the substrate and the transistor including the oxide semiconductor film 106.

Next, the base insulating film 104 is formed over the substrate 102 (see FIG. 2A). The base insulating film 104 has an effect to prevent diffusion of an impurity element such as hydrogen or moisture from the substrate 102, and can be formed with a single-layer structure or a stacked structure using one or more of a silicon nitride film, a silicon oxide film, a silicon nitride oxide film, and a silicon oxynitride film.

Further, as another effect of the base insulating film 104, oxygen can be supplied to the oxide semiconductor film 106 formed later. For example, in the case where an insulating film including oxide is formed as the base insulating film 104, by heating the base insulating film 104, part of contained oxygen can be released. Thus, oxygen can be supplied to the oxide semiconductor film 106, and oxygen vacancies in the oxide semiconductor film 106 can be filled accordingly. In particular, the base insulating film 104 preferably contains a large amount of oxygen which exceeds at least the stoichiometry thereof. For example, a film of silicon oxide represented by the formula $SiO_{2+\alpha}$ ($\alpha > 0$) is preferably used as the base insulating film 104. When such a silicon oxide film is used as the base insulating film 104, oxygen can be supplied to the oxide semiconductor film 106, so that the transistor 150 using the oxide semiconductor film 106 can have favorable transistor characteristics.

Before the base insulating film 104 is formed, plasma treatment or the like may be performed on the substrate 102. As plasma treatment, reverse sputtering in which an argon gas is introduced and plasma is generated can be performed. The reverse sputtering refers to a method in which an RF power source is used for application of a voltage to the substrate 102 side in an argon atmosphere so that plasma is generated in the vicinity of the substrate 102 to modify a surface of the substrate. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, the oxide semiconductor film 106 is formed over the base insulating film 104 (see FIG. 2A). The oxide semiconductor film 106 is preferably a CAAC-OS film. Note that the base insulating film 104 and the oxide semiconductor film 106 are preferably formed successively without being exposed to the air.

The CAAC-OS film that can be used for the oxide semiconductor film 106 is described in detail below.

The CAAC-OS film is not completely single crystal or completely amorphous. The CAAC-OS film is an oxide semiconductor film with a crystal-amorphous mixed phase structure where crystal portions are included in an amorphous phase. Note that in most cases, the crystal portion fits inside a cube whose one side is less than 100 nm. From an observation image obtained with a transmission electron microscope (TEM), a boundary between an amorphous portion and a crystal portion in the CAAC-OS film is not clear. Further, with the TEM, a grain boundary in the CAAC-OS film is not found. Thus, in the CAAC-OS film, a reduction in electron mobility due to the grain boundary is suppressed.

In each of the crystal portions included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal portions, the directions of an a-axis and a b-axis of one crystal portion may be different from those of another crystal portion. In this specification and the like, a simple term "perpendicular" includes a range from 85° to 95°. In addition, a simple term "parallel" includes a range from −5° to 5°.

In the CAAC-OS film, distribution of crystal portions is not necessarily uniform. For example, in the formation process of the CAAC-OS film, in the case where crystal growth occurs from a surface side of the oxide semiconductor film, the proportion of crystal portions in the vicinity of the surface of the oxide semiconductor film is higher than that in a vicinity of a surface where the oxide semiconductor film is formed in some cases.

Since the c-axes of the crystal portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal portion is the direction parallel to a normal vector of the surface where the CAAC-OS film is formed or a normal vector of the surface of the CAAC-OS film. The crystal portion is formed by film formation or by performing treatment for crystallization such as heat treatment after film formation.

With use of the CAAC-OS film in a transistor, change in electric characteristics of the transistor due to irradiation with visible light or ultraviolet light can be reduced. Change and variation in threshold voltages can be suppressed. Thus, the transistor has high reliability.

In an oxide semiconductor having crystallinity (crystalline oxide semiconductor), defects in the bulk can be further reduced. Further, when planarity of the surface of the crystalline oxide semiconductor film is enhanced, a top-gate transistor including such an oxide semiconductor can obtain higher field-effect mobility than a transistor including an amorphous oxide semiconductor. In order to enhance the surface planarity of the oxide semiconductor film, the oxide semiconductor is preferably formed over a flat surface. Specifically, the oxide semiconductor is preferably formed over a surface with an average surface roughness ($R_a$) less than or equal to 0.15 nm, preferably less than or equal to 0.1 nm.

Note that the average surface roughness ($R_a$) is obtained by expanding, into three dimensions, arithmetic mean surface roughness so as to be able to apply it to a curved surface. $R_a$ can be expressed as an "average value of the absolute values of deviations from a reference surface to a specific surface" and is defined by the following formula.

$$Ra = \frac{1}{S_0} \int_{y_1}^{y_2} \int_{x_1}^{x_2} |f(x, y) - Z_0| \, dx \, dy \qquad \text{[FORMULA 1]}$$

Here, the specific surface is a surface that is a target of roughness measurement, and is a quadrilateral region specified by four points represented by the coordinates ($x_1, y_1, f(x_1, y_1)$), ($x_1, y_2, f(x_1, y_2)$), ($x_2, y_1, f(x_2, y_1)$), and ($x_2, y_2, f(x_2, y_2)$). Moreover, $S_0$ represents the area of a rectangle which is obtained by projecting the specific surface on the xy plane, and $Z_0$ represents the height of the reference surface (the average height of the specific surface). $R_a$ can be measured using an atomic force microscope (AFM).

An oxide semiconductor used for the oxide semiconductor film 106 preferably contains at least indium (In) or zinc (Zn). In particular, In and Zn are preferably contained. As a stabilizer for reducing variation in electric characteristics of a transistor using the oxide semiconductor film, gallium (Ga) is preferably additionally contained. Tin (Sn) is preferably contained as a stabilizer. In addition, as a stabilizer, one or more selected from hafnium (Hf), zirconium (Zr), titanium (Ti), scandium (Sc), yttrium (Y), and an lanthanoid element (such as cerium (Ce), neodymium (Nd), or gadolinium (Gd), for example) is preferably contained.

As the oxide semiconductor, for example, any of the following can be used: indium oxide, tin oxide, zinc oxide, an In—Zn-based oxide, a Sn—Zn-based oxide, an Al—Zn-based oxide, a Zn—Mg-based oxide, a Sn—Mg-based oxide, an In—Mg-based oxide, an In—Ga-based oxide, an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—Zr—Zn-based oxide, an In—Ti—Zn-based oxide, an In—Sc—Zn-based oxide, an In—Y—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, an In—Lu—Zn-based oxide, an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, an "In—Ga—Zn-based oxide" means an oxide containing In, Ga, and Zn as its main components and there is no particular limitation on the ratio of In:Ga:Zn. The In—Ga—Zn-based oxide may contain a metal element other than the In, Ga, and Zn.

Alternatively, a material represented by $InMO_3(ZnO)_m$ (m>0 is satisfied, and m is not an integer) may be used as an oxide semiconductor. Note that M represents one or more metal elements selected from Ga, Fe, Mn, and Co, or the above-described element as a stabilizer. Alternatively, as the oxide semiconductor, a material expressed by a chemical formula, $In_2SnO_5(ZnO)_n$ (n>0, n is a natural number) may be used.

For example, an In—Ga—Zn-based oxide with an atomic ratio where In:Ga:Zn=1:1:1, In:Ga:Zn=3:1:2, or In:Ga:Zn=2:1:3, or any of oxides whose composition is in the neighborhood of the above compositions can be used.

In a formation step of the oxide semiconductor film 106, it is preferable that hydrogen or water be contained in the oxide semiconductor film 106 as little as possible. For example, it is preferable that the substrate 102 on which the base insulating film 104 is already formed be preheated in a preheating chamber of a sputtering apparatus as pretreatment for formation of the oxide semiconductor film 106 so that impurities such as hydrogen and moisture adsorbed to the substrate 102 and the base insulating film 104 are removed and evacuated. Then, the oxide semiconductor film 106 is preferably formed in a deposition chamber from which remaining moisture is removed.

In order to remove the moisture in the preheating chamber and the deposition chamber, an entrapment vacuum pump, for example, a cryopump, an ion pump, or a titanium sublimation pump is preferably used. Further, an evacuation unit may be a turbo pump provided with a cold trap. From the preheating chamber and the deposition chamber which is evacuated with a cryopump, a hydrogen atom, a compound containing a hydrogen atom such as water ($H_2O$) (more preferably, also a compound containing a carbon atom), and the like are removed, whereby the concentration of impurities such as hydrogen or moisture in the oxide semiconductor film 106 that is to be formed can be reduced.

Note that in this embodiment, an In—Ga—Zn-based oxide is deposited as the oxide semiconductor film 106 by a sputtering method. The oxide semiconductor film 106 can be formed by a sputtering method in a rare gas (typically argon) atmosphere, an oxygen atmosphere, or a mixed atmosphere of a rare gas and oxygen.

As a target used for forming an In—Ga—Zn-based oxide film as the oxide semiconductor film 106 by a sputtering method, for example, a metal oxide target with an atomic ratio where In:Ga:Zn=1:1:1, a metal oxide target with an atomic ratio where In:Ga:Zn=3:1:2, or a metal oxide target with an atomic ratio where In:Ga:Zn=2:1:3 can be used. However, a material and composition of a target used for formation of the oxide semiconductor film 106 is not limited to the above.

Further, when the oxide semiconductor film 106 is formed using the above metal oxide target, the composition of the target is different from the composition of a film formed over the substrate in some cases. For example, when the metal oxide target having a molar ratio where $In_2O_3:Ga_2O_3:ZnO=1:1:1$ is used, the composition ratio of the thin oxide semiconductor film 106 becomes $In_2O_3:Ga_2O_3:ZnO=1:1:0.6$ to 1:1:0.8 [molar ratio] in some cases, though it depends on the film formation conditions. This is because in formation of the oxide semiconductor film 106, ZnO is sublimed, or because a sputtering rate differs between the components of $In_2O_3$, $Ga_2O_3$, and ZnO.

Accordingly, when a thin film having a preferable composition ratio is formed, a composition ratio of the metal oxide target needs to be adjusted in advance. For example, in order to make the composition ratio of the thin oxide semiconductor film 106 be $In_2O_3:Ga_2O_3:ZnO=1:1:1$ [molar ratio], the composition ratio of the metal oxide target is made to be $In_2O_3:Ga_2O_3:ZnO=1:1:1.5$ [molar ratio]. In other words, the ZnO content of the metal oxide target is made higher in advance. The composition ratio of the target is not limited to the above value, and can be adjusted as appropriate depending on the film formation conditions or the composition of the thin film to be formed. Further, it is preferable to increase the ZnO content of the metal oxide target because in that case, the crystallinity of the obtained thin film is improved.

The relative density of the metal oxide target is 90% to 100% inclusive, preferably, 95% to 99.9% inclusive. By using the metal oxide target with high relative density, a dense oxide semiconductor film 106 can be formed.

As a sputtering gas used for forming the oxide semiconductor film 106, it is preferable to use a high-purity gas from which an impurity such as hydrogen, water, a hydroxyl group, or a hydride is removed.

There are three methods for forming a CAAC-OS film when the CAAC-OS film is used as the oxide semiconductor film 106. One of the methods (first method) is to form an oxide semiconductor film at a temperature higher than or equal to 100° C. and lower than or equal to 450° C. to form, in the oxide semiconductor film, crystal portions in which the c-axes are aligned in the direction parallel to a normal vector of a surface where the oxide semiconductor film is formed or a normal vector of a surface of the oxide semiconductor film. Another method (second method) is to form an oxide semiconductor film with a small thickness and then heat it at a temperature higher than or equal to 200° C. and lower than or equal to 700° C., to form, in the oxide semiconductor film, crystal portions in which the c-axes are aligned in the direction parallel to a normal vector of a surface where the oxide semiconductor film is formed or a normal vector of a surface of the oxide semiconductor film. The other method (third method) is to form a first oxide semiconductor film with a small thickness, then heat it at a temperature higher than or equal to 200° C. and lower than or equal to 700° C., and form a second oxide semiconductor film, to form, in the oxide semiconductor film, crystal portions in which the c-axes are aligned in the direction parallel to a normal vector of a surface where the oxide semiconductor film is formed or a normal vector of a surface of the oxide semiconductor film.

For example, the CAAC-OS film is formed by a sputtering method with a polycrystalline oxide semiconductor sputtering target. When ions collide with the sputtering target, a crystal region included in the sputtering target may be separated from the target along an a-b plane; in other words, a sputtered particle having a plane parallel to an a-b plane (flat-plate-like sputtered particle or pellet-like sputtered particle) may flake off from the sputtering target. In that case, the flat-plate-like sputtered particle reaches a substrate while maintaining their crystal state, whereby the CAAC-OS film can be formed.

For formation of the CAAC-OS film, the following conditions are preferably used.

By reducing the amount of impurities entering the CAAC-OS film during the deposition, the crystal state can be prevented from being broken by the impurities. For example, the concentration of impurities (e.g., hydrogen, water, carbon dioxide, or nitrogen) which exist in the deposition chamber may be reduced. Furthermore, the concentration of impurities in a deposition gas may be reduced. Specifically, a deposition gas whose dew point is −80° C. or lower, preferably −100° C. or lower is used.

By increasing the substrate heating temperature during the deposition, migration of a sputtered particle is likely to occur after the sputtered particle reaches a substrate surface. Specifically, the substrate heating temperature during the deposition is higher than or equal to 100° C. and lower than or equal to 740° C., preferably higher than or equal to 150° C. and lower than or equal to 500° C. By increasing the substrate heating temperature during the deposition, when the flat-plate-like sputtered particle reaches the substrate, migration occurs on the substrate surface, so that a flat plane of the flat-plate-like sputtered particle is attached to the substrate.

Furthermore, it is preferable that the proportion of oxygen in the deposition gas be increased and the power be optimized in order to reduce plasma damage at the deposition. The proportion of oxygen in the deposition gas is 30 vol. % or higher, preferably 100 vol. %.

Note that when a crystalline (single-crystal or microcrystalline) oxide semiconductor film other than a CAAC-OS film is formed as the oxide semiconductor film 106, there is no particular limitation on the deposition temperature.

Next, a conductive film used for a source electrode and a drain electrode (as well as a wiring formed in the same layer as the gate electrode) is formed over the base insulating film 104 and the oxide semiconductor film 106. As the conductive film used for the source electrode and the drain electrode, for example, a metal film containing an element selected from aluminum, chromium, copper, tantalum, titanium, molybdenum, or tungsten, or a metal nitride film containing any of the above elements as its component (e.g., a titanium nitride film, a molybdenum nitride film, or a tungsten nitride film) can be used. Alternatively, the conductive film may have a structure in which a film of a high-melting-point metal such as titanium, molybdenum, or tungsten, or a nitride film of any of these metals (a titanium nitride film, a molybdenum nitride film, or a tungsten nitride film) is stacked on either or both of the bottom surface and the top surface of a metal film of aluminum, copper, or the like. Further, the conductive film used for the source electrode and the drain electrode may be formed using a conductive metal oxide. As the conductive metal oxide, indium oxide ($In_2O_3$), tin oxide ($SnO_2$), zinc oxide (ZnO), indium tin oxide ($In_2O_3$—$SnO_2$, which is abbreviated to ITO in some cases), or indium zinc oxide ($In_2O_3$—ZnO) can be used. The conductive film used for the source electrode and the drain electrode can be formed using any of the above materials to have a single layer or a stacked structure. There is no particular limitation on the method for forming the conductive film, and a variety of film formation methods such as an evaporation method, a CVD method, a sputtering method, and a spin coating method can be employed.

Next, a resist mask is formed over the conductive film through a photolithography step and selective etching is performed, so that the source electrode 108a and the drain electrode 108b are formed. Then, the resist mask is removed (see FIG. 2B). For the light exposure for forming the resist mask in this photolithography step, ultraviolet, KrF laser, or ArF laser can be used.

In this step, a channel length L of the transistor 150 that is to be completed in a later step is determined by a distance between a lower end of the source electrode 108a and a lower end of the drain electrode 108b that are adjacent to each other over the oxide semiconductor film 106. When light exposure is performed for a channel length L smaller than 25 nm, the light exposure for forming the resist mask in the photolithography step may be performed using extreme ultraviolet light having an extremely short wavelength of several nanometers to several tens of nanometers, for example. In the light exposure by extreme ultraviolet light, the resolution is high and the focus depth is large. Thus, the channel length L of the transistor 150 formed later can be reduced, whereby the operation speed of a circuit can be increased.

In order to reduce the number of photomasks used in a photolithography step and reduce the number of photolithography steps, an etching step may be performed with use of a multi-tone mask which is a light-exposure mask through which light is transmitted to have a plurality of intensities. A resist mask formed with use of a multi-tone mask has a plurality of thicknesses and further can be changed in shape by etching; therefore, the resist mask can be used in a plurality of etching steps for processing into different patterns. Therefore, a resist mask corresponding to at least two kinds or more of different patterns can be formed by one multi-tone mask. Thus, the number of light-exposure masks can be reduced and the number of corresponding photolithography steps can be also reduced, whereby simplification of a process can be achieved.

Note that it is preferable that etching conditions be optimized so as not to etch and divide the oxide semiconductor film 106 when the conductive film is etched. However, it is difficult to obtain etching conditions in which only the conductive film is etched and the oxide semiconductor film 106 is not etched at all. In some cases, only part of the oxide semiconductor film 106, e.g., 5% to 50% in thickness of the oxide semiconductor film 106, is etched, so that the oxide semiconductor film 106 has a groove portion (a recessed portion) when the conductive film is etched.

Next, the gate insulating film 110 is formed to cover the oxide semiconductor film 106 and the source electrode 108a and the drain electrode 108b. The gate insulating film 110 can have a thickness greater than or equal to 1 nm and less than or equal to 500 nm. There is no particular limitation on the formation method of the gate insulating film 110; for example, a sputtering method, an MBE method, a CVD method, a pulsed laser deposition method, an ALD method, or the like can be used as appropriate for formation of the gate insulating film 110.

For the gate insulating film 110, an oxide insulating film having a sufficient withstand voltage and sufficient insulating properties is preferably used. In the case where the gate insulating film 110 has a single-layer structure, an oxide containing silicon such as a silicon oxide film may be used.

Further, when the gate insulating film 110 is formed, impurities such as silicon are taken to the oxide semiconductor film 106 in the vicinity of the interface with the gate insulating film 110. As a result, in the oxide semiconductor film 106, the region 106a is formed in the vicinity of the interface with the gate insulating film 110, and a region in the oxide semiconductor film 106 other than the region 106a is the region 106b.

Note that the concentration of silicon included in the region 106a is lower than or equal to 1.0 at. %, preferably lower than or equal to 0.1 at. %. The region 106a is provided to be in contact with the gate insulating film 110 to have a thickness less than or equal to 5 nm.

Further, in the case where impurities such as carbon is included in the gate insulating film 110, such impurities also enter the region 106a in the oxide semiconductor film 106 and serve as impurities, as in the case of silicon. In that case, the concentration of carbon included in the region 106a is lower than or equal to $1.0 \times 10^{20}$ atoms/cm$^3$, preferably lower than or equal to $1.0 \times 10^{19}$ atoms/cm$^3$.

Alternatively, the gate insulating film 110 may have a stacked structure. In the case where the gate insulating film 110 has a stacked structure, for example, gallium oxide, aluminum oxide, silicon nitride, silicon oxynitride, aluminum oxynitride, yttrium oxide, lanthanum oxide, silicon nitride oxide, or the like may be stacked over oxide containing silicon. Alternatively, a high-k material such as hafnium oxide, hafnium silicate (HfSi$_x$O$_y$ (x>0, y>0)), hafnium silicate to which nitrogen is added (HfSiO$_x$N$_y$ (x>0, y>0)), or hafnium aluminate (HfAl$_x$O$_y$ (x>0, y>0)) may be stacked over an oxide containing silicon.

When an oxide containing silicon is used as the gate insulating film 110, part of oxygen contained in the insulating film can be released by performing heat treatment described later; thus, oxygen can be supplied to the oxide semiconductor film 106, and oxygen vacancies in the oxide semiconductor film 106 can be filled. In particular, the gate insulating film 110 preferably contains a large amount of oxygen which exceeds at least the stoichiometry. For example, a film of silicon oxide represented by the formula SiO$_{2+\alpha}$ ($\alpha$>0) is preferably used as the gate insulating film 110. When such a silicon oxide film is used as the gate insulating film 110, oxygen can be supplied to the oxide semiconductor film 106, so that the transistor 150 using the oxide semiconductor film 106 can have favorable transistor characteristics.

In order to prevent impurities such as silicon from entering the oxide semiconductor film 106, the gate insulating film 110 is formed in such a manner as not to damage the oxide semiconductor film 106. For example, in the case where a silicon oxide film is formed as the gate insulating film 110 by a sputtering method, the impact of silicon (that is a constituent element of the gate insulating film 110) colliding with the oxide semiconductor film 106 may be reduced. For achieving the above, specifically, a method in which the power for deposition of the gate insulating film 110 is low, a method in which the pressure for deposition of the gate insulating film 110 is high, a method in which a distance between a target and a substrate (T-S distance) is increased in deposition of the gate insulating film 110, or the like can be used. However, a formation method of the gate insulating film 110 is not limited to the above. For example, a silicon oxide film, a silicon oxynitride film, a silicon nitride oxide film, or the like, which is formed by a PE-CVD method, can be used. A PE-CVD method is preferred to a sputtering method because with use of the PE-CVD method, the oxide semiconductor film 106 serving as a base film is less damaged.

Next, a conductive film used for formation of a gate electrode (as well as a wiring formed in the same layer as the gate electrode) is formed over the gate insulating film 110. The conductive film used for the gate electrode can be formed using, for example, a metal material such as molybdenum, titanium, tantalum, tungsten, aluminum, copper, neodymium, or scandium, or an alloy material including any of these materials as a main component. Alternatively, the conductive film used for the gate electrode may be formed using a conductive metal oxide. As the conductive metal oxide, indium oxide (In$_2$O$_3$), tin oxide (SnO$_2$), zinc oxide (ZnO), indium tin oxide (In$_2$O$_3$—SnO$_2$, which is abbreviated to ITO in some cases), indium zinc oxide (In$_2$O$_3$—ZnO), or any of these metal oxide materials in which silicon or silicon oxide is included can be used. The gate electrode can be formed to have a single layer or a stacked structure using any of the above materials. There is no particular limitation on the method for forming the conductive film, and a variety of film formation methods such as an evaporation method, a CVD method, a sputtering method, and a spin coating method can be employed.

Next, a resist mask is formed over the conductive film through a photolithography step and selective etching is performed, so that the gate electrode 112 is formed. Then, the resist mask is removed (see FIG. 2C). The resist mask used for forming the gate electrode 112 may be formed by an inkjet method. Formation of the resist mask by an inkjet method needs no photomask; thus, manufacturing cost can be reduced. For etching the gate electrode 112, wet etching, dry etching, or both of them may be employed. Note that when the gate electrode 112 is formed, the transistor 150 is formed.

Next, the interlayer insulating film 114 is formed over the gate insulating film 110 and the gate electrode 112 (see FIG. 2D).

The interlayer insulating film 114 is preferably formed using an inorganic insulating film to have a single layer or a stacked layer of any of oxide insulating films such as a silicon oxide film, a silicon oxynitride film, an aluminum oxide film, an aluminum oxynitride film, a gallium oxide film, and a hafnium oxide film. Further, over the above oxide insulating film, a single layer or a stacked layer of any of nitride insulating films such as a silicon nitride film, a silicon nitride oxide film, an aluminum nitride film, and an aluminum nitride oxide film may be formed. For example, as a stacked layer, a silicon oxide film and an aluminum oxide film are deposited in this order over the gate electrode 112.

After the formation of the interlayer insulating film 114, heat treatment is preferably performed on the oxide semiconductor film 106. The temperature of the heat treatment is higher than or equal to 300° C. and lower than or equal to 700° C., or lower than the strain point of a substrate.

The heat treatment may be performed in an atmosphere of nitrogen, oxygen, ultra-dry air (air in which the moisture content is less than or equal to 20 ppm, preferably less than or equal to 1 ppm, further preferably less than or equal to 10 ppb), or a rare gas (such as argon or helium). Note that it is preferable that water, hydrogen, and the like be not contained in the atmosphere of nitrogen, oxygen, ultra-dry air, a rare gas, or the like. It is also preferable that the purity of nitrogen, oxygen, or the rare gas which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

In the case of performing heat treatment after formation of the oxide semiconductor film, oxygen that is one of main component materials included in the oxide semiconductor might be reduced. However, during the heat treatment in this step, oxygen can be supplied to the oxide semiconductor film 106 from the base insulating film 104 or the gate insulating film 110 which is formed using an oxide containing silicon; thus, oxygen vacancies in the oxide semiconductor film 106 can be filled.

By performing the heat treatment as described above, the oxide semiconductor film 106 can be highly purified so as not to contain impurities other than main components as little as possible. The highly purified oxide semiconductor film 106 contains extremely few (close to zero) carriers derived from a donor, and the carrier concentration thereof is lower than $1 \times 10^{14}/\text{cm}^3$, preferably lower than $1 \times 10^{12}/\text{cm}^3$, further preferably lower than $1 \times 10^{11}/\text{cm}^3$. In such a manner, the oxide semiconductor film 106 that becomes an i-type (intrinsic) oxide semiconductor can be formed.

Through the above steps, the transistor 150 is formed. In the transistor 150, the concentration of impurities such as silicon taken into the region 106a of the oxide semiconductor film 106 is small. Further, in the case where the oxide semiconductor film is a CAAC-OS film, a crystal portion can be formed even in the vicinity of the interface between the oxide semiconductor film and the gate insulating film 110. Thus, the transistor 150 can have stable electric characteristics.

Over the interlayer insulating film 114, a planarization insulating film may be further provided. The planarization insulating film can be formed using an organic material having heat resistance, such as, an acrylic resin, a polyimide resin, a benzocyclobutene-based resin, a polyamide resin, or an epoxy resin can be used. Other than such organic materials, a low-dielectric constant material (a low-k material) or a siloxane-based resin can be used. Note that the planarization insulating film may be formed by stacking a plurality of insulating films formed of any of these materials.

The methods and structures described in this embodiment can be combined as appropriate with any of the methods and structures described in the other embodiments.

Embodiment 2

In this embodiment, modification examples of the semiconductor device and the method for manufacturing the semiconductor device of Embodiment 1, which are illustrated in FIGS. 1A and 1B and FIGS. 2A to 2D, will be described with reference to FIGS. 3A and 3B, FIGS. 4A to 4D, FIGS. 5A and 5B. Note that portions similar to those in FIGS. 1A and 1B and FIGS. 2A to 2D are denoted by the same reference numerals, and description thereof is skipped.

Example of Structure of Semiconductor Device

Modification Example

Figure 3A:
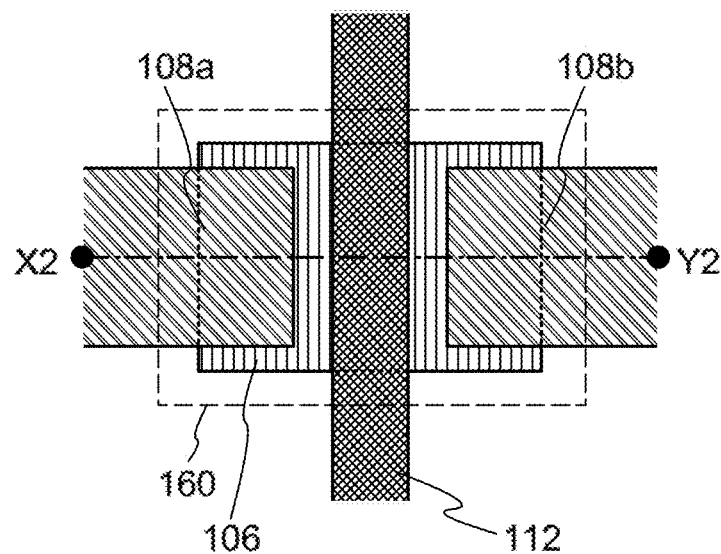
FIGS. 3A and 3B are a plan view and a cross-sectional view illustrating one embodiment of a semiconductor device.
Figure 3B:
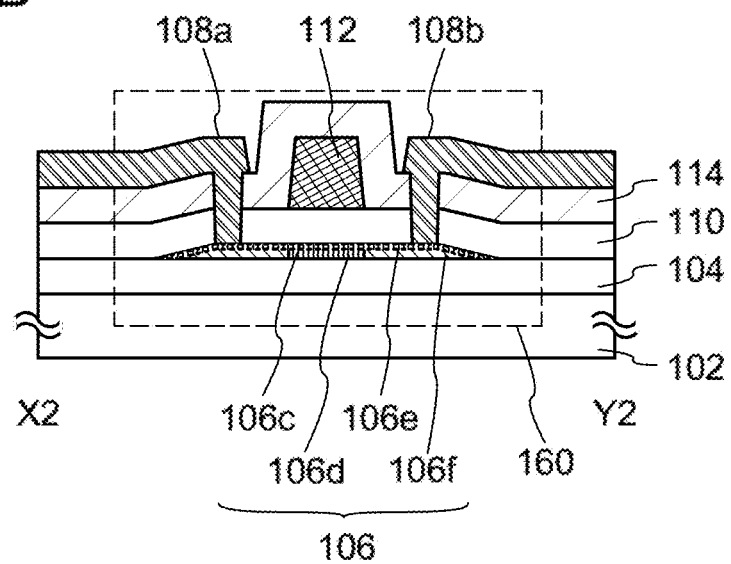

In FIGS. 3A and 3B, a top-gate transistor is illustrated as an example of a semiconductor device. FIG. 3A is a plan view, and FIG. 3B is a cross-sectional view taken along dashed line X2-Y2 in FIG. 3A. Note that in FIG. 3A, some components of a transistor 160 (e.g., a gate insulating film 110) are omitted for simplicity.

The transistor 160 illustrated in FIGS. 3A and 3B includes, over a substrate 102, a base insulating film 104, an oxide semiconductor film 106 which is formed over the base insulating film 104 and includes a region 106c, a region 106d, a region 106e, and a region 106f, the gate insulating film 110 formed over the oxide semiconductor film 106, a gate electrode 112 provided to be in contact with the gate insulating film 110 and overlap with at least the oxide semiconductor film 106, an interlayer insulating film 114 formed over the gate insulating film 110 and the gate electrode 112, and a source electrode 108a and a drain electrode 108b which are provided over the interlayer insulating film 114 and electrically connected to the oxide semiconductor film 106.

The oxide semiconductor film 106 includes the region 106c and the region 106d, which function as a channel formation region, and the region 106e and the region 106f which function as a pair of low resistance regions provided so that the channel formation region is sandwiched therebetween.

Further, as illustrated in FIG. 3B, an end portion of the oxide semiconductor film 106 is preferably tapered at an angle of 20° to 50°. When the oxide semiconductor film 106 has a perpendicular end portion, oxygen is more likely to be released from the end portion of the oxide semiconductor film 106, and accordingly, oxygen vacancies are likely to be generated. When the oxide semiconductor film 106 has a tapered end portion, generation of oxygen vacancies is suppressed, and thus generation of leakage current of the transistor 160 can be reduced.

For the gate insulating film 110, an oxide insulating film having a sufficient withstand voltage and sufficient insulating properties is preferably used. In the case where the gate insulating film 110 has a single-layer structure, an oxide containing silicon, such as a silicon oxide film, may be used, for example.

When an oxide containing silicon is used as the gate insulating film 110, part of oxygen contained in the insulating film can be released by performing heat treatment; thus, oxygen can be supplied to the oxide semiconductor film 106, and oxygen vacancies in the oxide semiconductor film 106 can be filled. In particular, the gate insulating film 110 preferably contains a large amount of oxygen which exceeds at least the stoichiometry. For example, a film of silicon oxide represented by the formula $SiO_{2+\alpha}$ ($\alpha>0$) is preferably used as the gate insulating film 110. When such a silicon oxide film is used as the gate insulating film 110, oxygen can be supplied to the oxide semiconductor film 106, so that the transistor 160 using the oxide semiconductor film 106 can have favorable transistor characteristics.

However, in the case of using a silicon oxide film as the gate insulating film 110, silicon that is a constituent element of the gate insulating film 110 might be taken as an impurity into the oxide semiconductor film 106. Silicon which is a constituent element of the gate insulating film 110 or the like enters the oxide semiconductor film 106 and serves as an impurity, which affects characteristics of the transistor. Further, in the case where the oxide semiconductor film 106 is a CAAC-OS film, a constituent element of the gate insulating film 110 enters the oxide semiconductor film 106, and a bond in the crystal portion in the oxide semiconductor film 106 is broken. Thus, amorphous regions are more formed in the oxide semiconductor film 106 in the vicinity of the gate insulating film 110.

In particular, impurities such as silicon are likely to enter the oxide semiconductor film 106 in the vicinity of the gate insulating film 110. A channel formation region of the transistor 160 is formed in the oxide semiconductor film 106 in the vicinity of the interface with the gate insulating film 110; thus, when impurities such as silicon enter the vicinity of the interface between the oxide semiconductor film 106 and the gate insulating film 110, characteristics of the transistor 150 might be changed.

Thus, in the semiconductor device described in this embodiment, entry of impurities such as silicon into the oxide semiconductor film 106 in the vicinity of the interface with the gate insulating film 110 is suppressed. As a result, in the oxide semiconductor film 106, a region in which the concentration of silicon distributed from an interface with the gate insulating film 110 toward an inside of the oxide semiconductor film 106 is lower than or equal to 1.0 at. % is formed. Such a region is referred to as the region 106c and the region 106e in FIG. 3B. The concentrations of silicon included in the region 106c and the region 106e are further preferably lower than or equal to 0.1 at. %. Further, the region 106c and the region 106e are provided to be in contact with the gate insulating film 110 and have a thickness less than or equal to 5 nm.

Note that in FIG. 3B, in the oxide semiconductor film 106, regions on the base insulating film 104 side are the region 106d and the region 106f, and regions on the gate insulating film 110 side are the region 106c and the region 106e.

Further, in the case where impurities such as carbon is included in the gate insulating film 110, such impurities might also enter the oxide semiconductor film 106 and serve as impurities, as in the case of silicon. In that case, the concentrations of carbon included in the region 106c and the region 106e are lower than or equal to $1.0 \times 10^{20}$ atoms/cm$^3$, preferably lower than or equal to $1.0 \times 10^{19}$ atoms/cm$^3$.

In order to prevent impurities such as silicon from entering the oxide semiconductor film 106, the gate insulating film 110 may be formed in such a manner as not to damage the oxide semiconductor film 106. For example, in the case where a silicon oxide film is formed as the gate insulating film 110 by a sputtering method, the impact caused by silicon (that is a constituent element of the gate insulating film 110) colliding with the oxide semiconductor film 106 may be reduced. For achieving the above, specifically, a method in which the power for deposition of the gate insulating film 110 is low, a method in which the pressure for deposition of the gate insulating film 110 is high, a method in which a distance between a target and a substrate (T-S distance) is increased in deposition of the gate insulating film 110, or the like can be used. However, a formation method of the gate insulating film 110 is not limited to the above. For example, a silicon oxide film, a silicon oxynitride film, a silicon nitride oxide film, or the like, which is formed by a PE-CVD method, can be used. A PE-CVD method is preferred to a sputtering method because with use of the PE-CVD method, the oxide semiconductor film 106 serving as a base film is less damaged.

As described above, the concentrations of impurities such as silicon and carbon entering the region 106c and the region 106e in the oxide semiconductor film 106 are reduced, whereby change in characteristics of the transistor 160 can be suppressed. Further, in the case where the oxide semiconductor film 106 is a CAAC-OS film, a crystal portion can be formed even in the vicinity with the gate insulating film 110. When the transistor 160 is formed using such an oxide semiconductor film 106, a semiconductor device with stable electric characteristics can be provided.

Note that the details of the other components of the transistor are described with reference to FIGS. 4A to 4D and FIGS. 5A and 5B, in description of a method for manufacturing the transistor 160 below.

<Manufacturing Method of Transistor 160>

Hereinafter, an example of a method for manufacturing the transistor 160 illustrated in FIGS. 3A and 3B of this embodiment is described with reference to FIGS. 4A to 4D and FIGS. 5A and 5B.

First, the substrate 102 is prepared. A substrate having a structure similar to that described in Embodiment 1 can be used as the substrate 102.

Figure 4A:
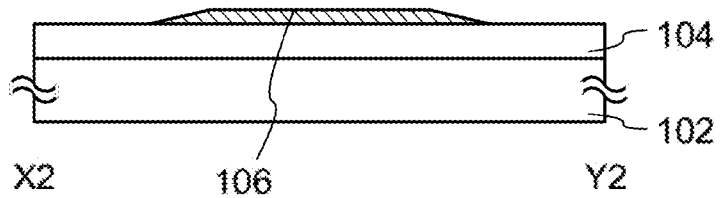
FIGS. 4A to 4D are cross-sectional views illustrating an example of a manufacturing process of a semiconductor device.

Next, the base insulating film 104 is formed over the substrate 102 (see FIG. 4A). The base insulating film 104 has a function of preventing diffusion of an impurity element such as hydrogen or moisture from the substrate 102, and can be formed with a single-layer structure or a stacked structure using one or more of a silicon nitride film, a silicon oxide film, a silicon nitride oxide film, and a silicon oxynitride film.

In addition, the base insulating film 104 has another function of supplying oxygen to the oxide semiconductor film 106 formed later. For example, in the case where an insulating film containing an oxide is formed as the base insulating film 104, by heating the base insulating film 104, part of contained oxygen can be released. Thus, oxygen can be supplied to the oxide semiconductor film 106, and oxygen vacancies in the oxide semiconductor film 106 can be filled accordingly. In particular, the base insulating film 104 preferably contains a large amount of oxygen which exceeds at least the stoichiometry thereof. For example, a film of silicon oxide represented by the formula $SiO_{2+\alpha}$ ($\alpha > 0$) is preferably used as the base insulating film 104. When such a silicon oxide film is used as the base insulating film 104, oxygen can be supplied to the oxide semiconductor film 106, so that the transistor 160 using the oxide semiconductor film 106 can have favorable transistor characteristics.

Before the base insulating film 104 is formed, plasma treatment or the like may be performed on the substrate 102. As plasma treatment, reverse sputtering in which an argon gas is introduced and plasma is generated can be performed. As plasma treatment, reverse sputtering in which an argon gas is introduced and plasma is generated can be performed. The reverse sputtering refers to a method in which an RF power source is used for application of a voltage to the substrate 102 side in an argon atmosphere so that plasma is generated in the vicinity of the substrate 102 to modify a surface of the substrate. Note that instead of an argon atmosphere, a nitrogen atmosphere, a helium atmosphere, an oxygen atmosphere, or the like may be used. The reverse sputtering can remove particle substances (also referred to as particles or dust) attached to the surface of the substrate 102.

Next, the oxide semiconductor film 106 is formed over the base insulating film 104 (see FIG. 4A). The oxide semiconductor film 106 is preferably a CAAC-OS film. Note that the base insulating film 104 and the oxide semiconductor film 106 are preferably formed successively without being exposed to the air.

The oxide semiconductor film 106 can have a structure similar to that described in Embodiment 1.

Figure 4B:
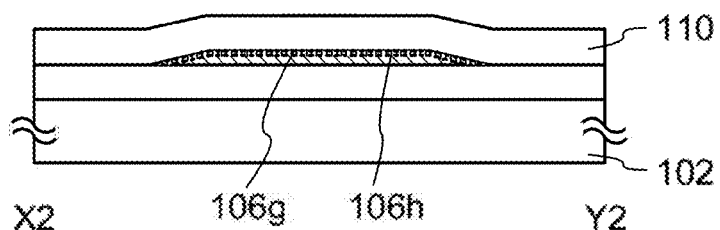
Figure 4C:
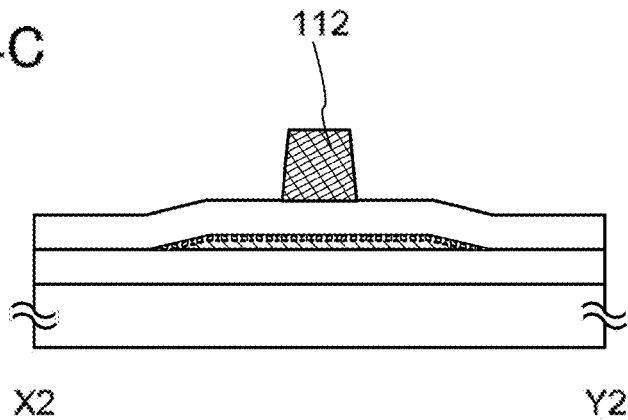

Next, the gate insulating film 110 is formed to cover the oxide semiconductor film 106 (see FIG. 4B). The thickness of the gate insulating film 110 can be greater than or equal to 1 nm and less than or equal to 500 nm. There is no particular limitation on the formation method of the gate insulating film 110; for example, a sputtering method, an MBE method, a CVD method, a pulsed laser deposition method, an ALD method, or the like can be used as appropriate for formation of the gate insulating film 110.

For the gate insulating film 110, an oxide insulating film having a sufficient withstand voltage and sufficient insulating properties is preferably used. In the case where the gate insulating film 110 has a single-layer structure, an oxide containing silicon film such as a silicon oxide film, may be used, for example.

Further, when the gate insulating film 110 is formed, impurities such as silicon enter the oxide semiconductor film 106 in the vicinity of the interface with the gate insulating film 110. As a result, in the oxide semiconductor film 106, a region 106g is formed in the vicinity of the interface with the gate insulating film 110, and a region in the oxide semiconductor film 106 other than the region 106g is a region 106h. Note that the region 106g becomes the region 106c and the region 106e in a later step, and the region 106h becomes the region 106d and the region 106f in the later step.

The concentration of silicon included in the region 106g is lower than or equal to 1.0 at. %, preferably lower than or equal to 0.1 at. %. Further, the region 106g is provided to be in contact with the gate insulating film 110 to have a thickness less than or equal to 5 nm.

Further, in the case where impurities such as carbon is included in the gate insulating film 110, such impurities also enter the region 106g of the oxide semiconductor film 106 and serve as impurities, as in the case of silicon. In that case, the concentration of carbon included in the region 106g is lower than or equal to $1.0 \times 10^{20}$ atoms/cm$^3$, preferably lower than or equal to $1.0 \times 10^{19}$ atoms/cm$^3$.

The gate insulating film 110 may have a stacked structure. In the case where the gate insulating film 110 has a stacked structure, for example, gallium oxide, aluminum oxide, silicon nitride, silicon oxynitride, aluminum oxynitride, yttrium oxide, lanthanum oxide, silicon nitride oxide, or the like may be stacked over oxide containing silicon. Alternatively, a high-k material such as hafnium oxide, hafnium silicate (Hf-Si$_x$O$_y$ (x>0, y>0)), hafnium silicate to which nitrogen is added (HfSiO$_x$N$_y$ (x>0, y>0)), or hafnium aluminate (HfAl$_x$O$_y$ (x>0, y>0)) may be stacked over an oxide containing silicon.

When an oxide containing silicon is used as the gate insulating film 110, part of oxygen contained in the insulating film can be released by performing heat treatment; thus, oxygen can be supplied to the oxide semiconductor film 106, and oxygen vacancies in the oxide semiconductor film 106 can be filled. In particular, the gate insulating film 110 preferably contains a large amount of oxygen which exceeds at least the stoichiometry. For example, a film of silicon oxide represented by the formula SiO$_{2+\alpha}$ ($\alpha$>0) is preferably used as the gate insulating film 110. When such a silicon oxide film is used as the gate insulating film 110, oxygen can be supplied to the oxide semiconductor film 106, so that the transistor 160 using the oxide semiconductor film 106 can have favorable transistor characteristics.

In order to prevent impurities such as silicon from entering the oxide semiconductor film 106, the gate insulating film 110 is formed in such a manner as not to damage the oxide semiconductor film 106. For example, in the case where a silicon oxide film is formed as the gate insulating film 110 by a sputtering method, the impact of silicon (that is a constituent element of the gate insulating film 110) colliding with the oxide semiconductor film 106 may be reduced. For achieving the above, specifically, a method in which the power for deposition of the gate insulating film 110 is low, a method in which the pressure for deposition of the gate insulating film 110 is high, a method in which a distance between a target and a substrate (T-S distance) is increased in deposition of the gate insulating film 110, or the like can be used. However, a formation method of the gate insulating film 110 is not limited to the above. For example, a silicon oxide film, a silicon oxynitride film, a silicon nitride oxide film, or the like, which is formed by a PE-CVD method, can be used. A PE-CVD method is preferred to a sputtering method because with use of the PE-CVD method, the oxide semiconductor film 106 serving as a base film is less damaged.

Next, a conductive film used for formation of a gate electrode (as well as a wiring formed in the same layer as the gate electrode) is formed over the gate insulating film 110. The conductive film used for the gate electrode may have a structure similar to that of a material and the like described in Embodiment 1.

Next, a resist mask is formed over the conductive film through a photolithography step and selective etching is performed, so that the gate electrode 112 is formed. Then, the resist mask is removed (see FIG. 4C). The resist mask used for forming the gate electrode 112 may be formed by an inkjet method. Formation of the resist mask by an inkjet method needs no photomask; thus, manufacturing cost can be reduced. For etching the gate electrode 112, wet etching, dry etching, or both of them may be employed.

Figure 4D:
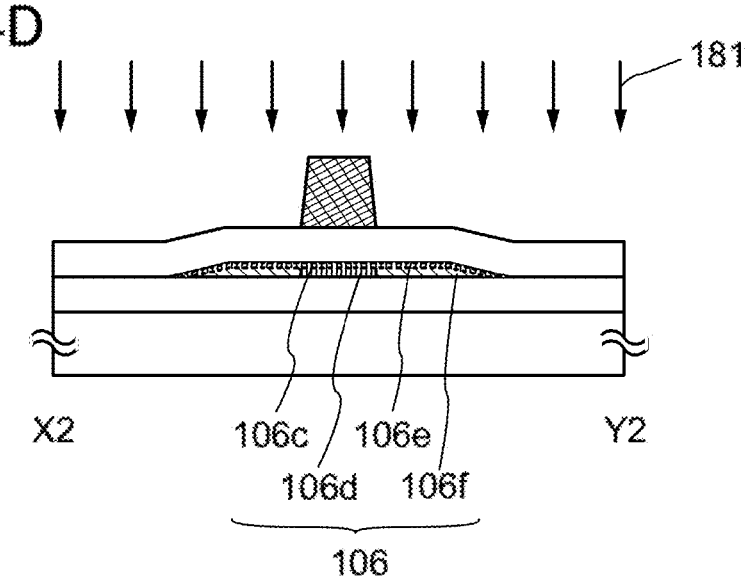

Next, dopant 181 is introduced into the oxide semiconductor film 106 with use of the gate electrode 112 as a mask, so that a pair of low resistance regions 106e and a pair of low resistance regions 106f are formed (see FIG. 4D).

The dopant 181 is an impurity by which the electrical conductivity of the oxide semiconductor film 106 is changed. One or more selected from the following can be used as the dopant 181: Group 15 elements (typical examples thereof are phosphorus (P), arsenic (As), and antimony (Sb)), boron (B), aluminum (Al), nitrogen (N), argon (Ar), helium (He), neon (Ne), indium (In), fluorine (F), chlorine (Cl), titanium (Ti), and zinc (Zn).

The dopant 181 can be introduced into the oxide semiconductor film 106 through another film (e.g., the gate insulating film 110) by an implantation method. As a method for introducing the dopant 181, an ion implantation method, an ion doping method, a plasma immersion ion implantation method, or the like can be used. In the case where the above method is used, it is preferable to use a single ion of the dopant 181, a fluoride ion, or a chloride ion.

The introduction of the dopant 181 may be controlled by setting the implantation conditions such as the accelerated voltage and the dosage, or the thickness of the films through which the dopant passes as appropriate. In this embodiment, phosphorus is used as the dopant 181, whose ion is added by an ion implantation method. The dosage of the dopant 181 can be set to be greater than or equal to $1 \times 10^{13}$ ions/cm$^2$ and less than or equal to $5 \times 10^{16}$ ions/cm$^2$.

The concentration of the dopant 181 in the low-resistance regions is preferably higher than or equal to $5 \times 10^{18}$/cm$^3$ and lower than or equal to $1 \times 10^{22}$/cm$^3$.

The substrate 102 may be heated while the dopant 181 is introduced.

The introduction of the dopant 181 into the oxide semiconductor film 106 may be performed plural times, and the number of kinds of dopant may be plural.

After the dopant 181 is introduced, heat treatment may be performed. The heat treatment is preferably performed at a temperature higher than or equal to 300° C. and lower than or equal to 700° C., preferably higher than or equal to 300° C. and lower than or equal to 450° C. for one hour in an oxygen atmosphere. The heat treatment may be performed in a nitrogen atmosphere, reduced pressure, or the air (ultra-dry air).

In the case where the oxide semiconductor film 106 is a crystalline oxide semiconductor film or a CAAC-OS film, part of the oxide semiconductor film may be amorphous by introduction of the dopant 181. In that case, the crystallinity of the oxide semiconductor film 106 can be recovered by performing heat treatment thereon after the introduction of the dopant 181.

Through the above steps, the region 106e and the region 106f between which the region 106c and the region 106d functioning as a channel formation region are sandwiched are formed in the oxide semiconductor film 106.

Figure 5A:
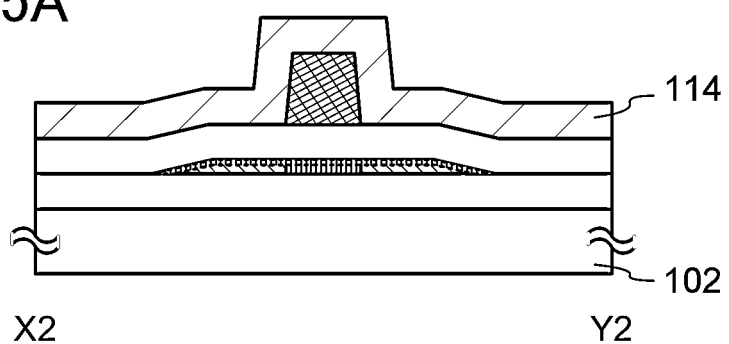
FIGS. 5A and 5B are cross-sectional views illustrating an example of a manufacturing process of a semiconductor device.

Next, the interlayer insulating film 114 is formed over the gate insulating film 110 and the gate electrode 112 (see FIG. 5A).

As the interlayer insulating film 114, an inorganic insulating film is preferable; a single layer or a stacked layer of any of oxide insulating films of a silicon oxide film, a silicon oxynitride film, an aluminum oxide film, an aluminum oxynitride film, a gallium oxide film, a hafnium oxide film, and the like. Further, over the above oxide insulating film, a single layer or a stacked layer of any of nitride insulating films of a silicon nitride film, a silicon nitride oxide film, an aluminum nitride film, an aluminum nitride oxide film, and the like may be formed. For example, a silicon oxide film and an aluminum oxide film are stacked in this order on the gate electrode 112 side by a sputtering method.

In the case where an aluminum oxide film is used as the interlayer insulating film, during or after the manufacturing process, the aluminum oxide film can serve to prevent impurities such as hydrogen or moisture, which causes a change in electric characteristics of the transistor 160, from entering the oxide semiconductor film 106. In addition, during or after the manufacturing process, the aluminum oxide film can serve to prevent oxygen which is a main component of an oxide semiconductor from being released from the oxide semiconductor film 106.

After the interlayer insulating film 114 is formed, it is preferable to perform heat treatment on the oxide semiconductor film 106. The temperature of the heat treatment is higher than or equal to 300° C. and lower than or equal to 700° C., or lower than the strain point of a substrate.

The heat treatment may be performed in an atmosphere of nitrogen, oxygen, ultra-dry air (air in which the moisture content is less than or equal to 20 ppm, preferably less than or equal to 1 ppm, further preferably less than or equal to 10 ppb), or a rare gas (such as argon or helium). Note that it is preferable that water, hydrogen, and the like be not contained in the atmosphere of nitrogen, oxygen, ultra-dry air, a rare gas, or the like. It is also preferable that the purity of nitrogen, oxygen, or the rare gas which is introduced into a heat treatment apparatus be set to higher than or equal to 6N (99.9999%), preferably higher than or equal to 7N (99.99999%) (that is, the impurity concentration is lower than or equal to 1 ppm, preferably lower than or equal to 0.1 ppm).

In the case of performing heat treatment after formation of the oxide semiconductor film, oxygen which is one of main components of the oxide semiconductor might be reduced. However, during the heat treatment in this step, oxygen can be supplied to the oxide semiconductor film 106 from the base insulating film 104 or the gate insulating film 110 which is formed using an oxide containing silicon; thus, oxygen vacancies in the oxide semiconductor film 106 can be filled.

By performing the heat treatment as described above, the oxide semiconductor film 106 can be highly purified so as not to contain impurities other than main components as little as possible. The highly purified oxide semiconductor film 106 includes extremely few (close to zero) carriers derived from a donor, and the carrier concentration thereof is lower than $1\times10^{14}/cm^3$, preferably lower than $1\times10^{12}/cm^3$, further preferably lower than $1\times10^{11}/cm^3$. In such a manner, the oxide semiconductor film 106 that becomes an i-type (intrinsic) oxide semiconductor can be formed.

Next, an opening portion reaching the oxide semiconductor film 106 (the region 106e or the region 106f) is formed in the gate insulating film 110 and the interlayer insulating film 114, and a conductive film used for the source electrode and the drain electrode (as well as a wiring formed in the same layer as the gate electrode) is formed in the opening portion. The conductive film used for the source electrode and the drain electrode may be formed using a material and a structure similar to those described in Embodiment 1.

Next, a resist mask is formed over the conductive film through a photolithography step and selective etching is performed, so that the source electrode 108a and the drain electrode 108b are formed. Then, the resist mask is removed (see FIG. 5B).

Figure 5B:
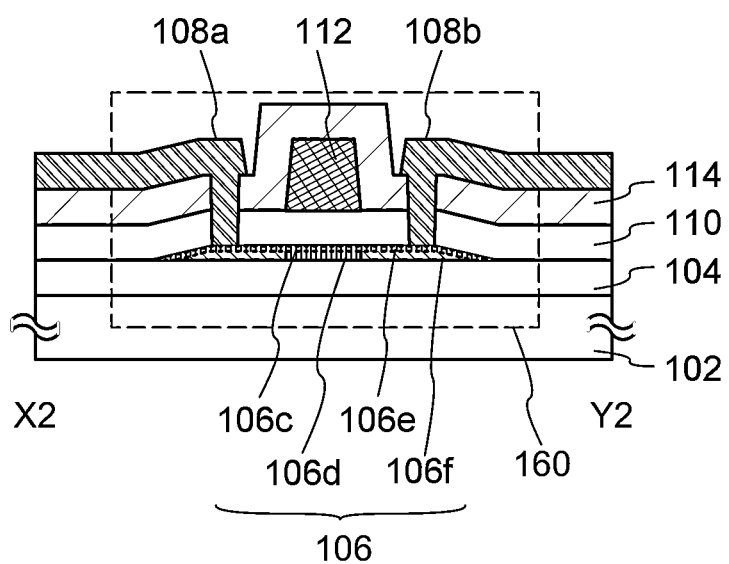

Through the above-described process, the transistor 160 is formed (see FIG. 5B). In the transistor 160, the concentration of silicon entering the region 106c and the region 106e in the oxide semiconductor film 106 is reduced. Further, in the case where the oxide semiconductor film 106 is a CAAC-OS film, a crystal portion can be formed even in the vicinity of the interface with the gate insulating film 110. Thus, the transistor 160 can have stable electric characteristics.

Furthermore, a planarization insulating film may be provided over the transistor 160. The planarization insulating film can be formed using an organic material having heat resistance, such as an acrylic resin, a polyimide resin, a benzocyclobutene-based resin, a polyamide-based resin, or an epoxy-based resin. Other than such organic materials, a low-dielectric constant material (a low-k material) or a siloxane-based resin can be used. Note that the planarization insulating film may be formed by stacking a plurality of insulating films formed of any of these materials.

The methods and structures described in this embodiment can be combined as appropriate with any of the methods and structures described in the other embodiments.

Embodiment 3

In this embodiment, an example of a semiconductor device which includes the transistor described in this specification, which can hold stored data even when not powered, and which does not have a limitation on the number of write cycles, will be described with reference to drawings.

Figure 6A:
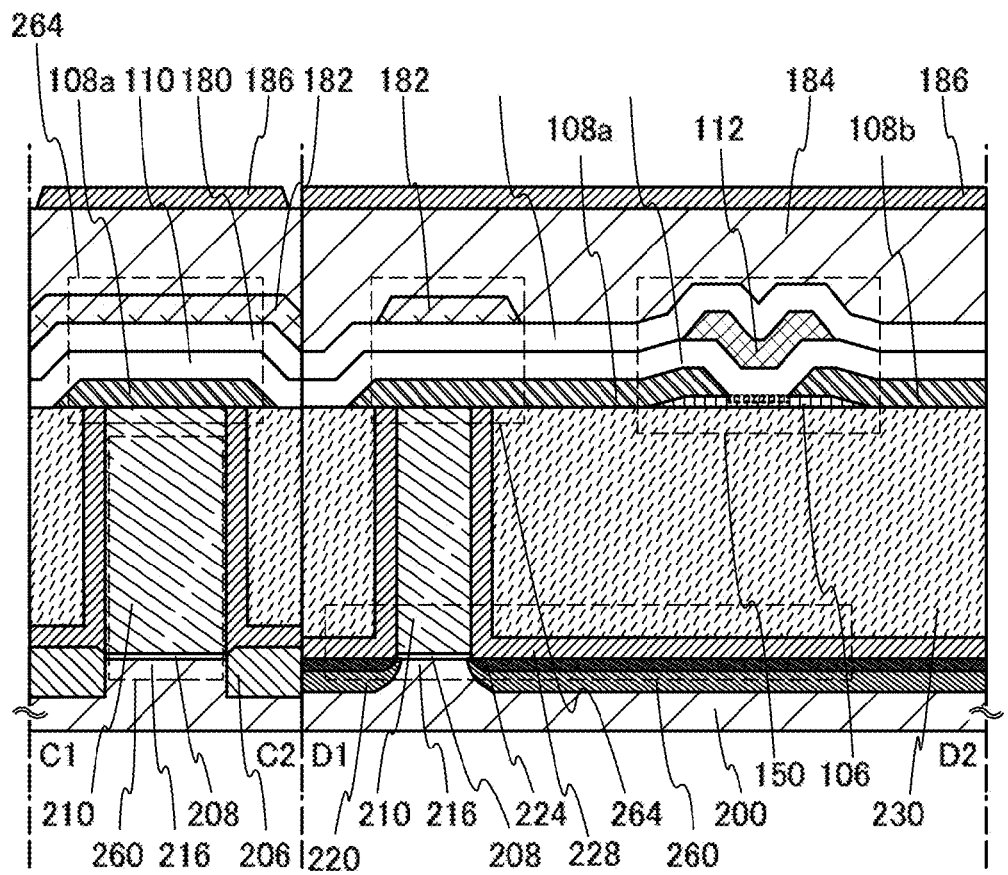
FIGS. 6A to 6C illustrate one embodiment of a semiconductor device.
Figure 6B:
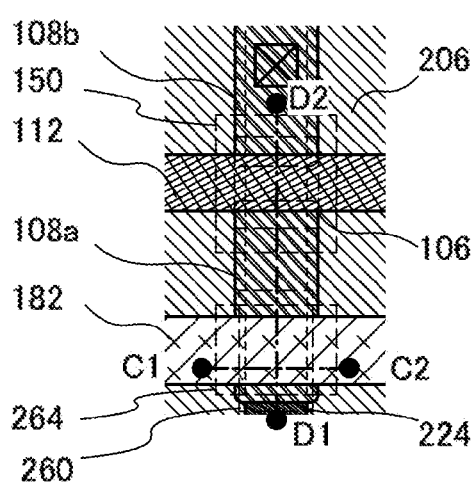
Figure 6C:
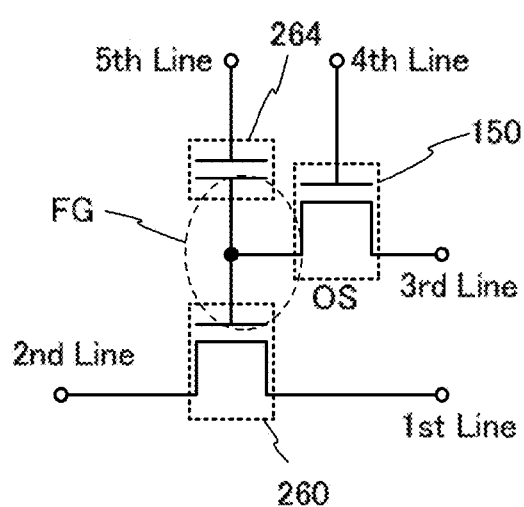

FIGS. 6A to 6C illustrate one example of a structure of the semiconductor device. FIG. 6A is a cross-sectional view of the semiconductor device, FIG. 6B is a plan view of the semiconductor device, and FIG. 6C is a circuit diagram of the semiconductor device. FIG. 6A is a cross-sectional view taken along line C1-C2 and line D1-D2 in FIG. 6B.

The semiconductor device illustrated in FIGS. 6A and 6B includes a transistor 260 including a first semiconductor material in a lower portion, and a transistor 150 including a second semiconductor material in an upper portion. A transistor having the structure described in Embodiment 1 can be employed for the transistor 150. The transistor 150 has a structure in which a source electrode 108a and a drain electrode 108b are provided to be in contact with an oxide semiconductor film 106. Note that although there is no description, the transistor described in Embodiment 2 can also be employed in this embodiment.

Here, the first semiconductor material and the second semiconductor material are preferably materials having different band gaps. For example, the first semiconductor material may be a semiconductor material other than an oxide semiconductor (e.g., single crystal silicon) and the second semiconductor material may be an oxide semiconductor. A transistor including single crystal silicon as a material other than an oxide semiconductor can operate at high speed. On the other hand, a transistor including an oxide semiconductor enables holding of charge for a long time owing to its characteristics.

Although all the transistors are n-channel transistors here, it is needless to say that p-channel transistors can be used. Although an oxide semiconductor in the transistor 150 described in Embodiment 1 is used so that data can be held, it is not necessary to limit a specific structure of the semiconductor device, such as a material of the semiconductor device or a structure of the semiconductor device, to the structure described here.

The transistor 260 illustrated in FIG. 6A includes a channel formation region 216 provided in a substrate 200 including a semiconductor material (e.g., silicon), impurity regions 220 with the channel formation region 216 provided therebetween, intermetallic compound regions 224 in contact with the impurity regions 220, a gate insulating film 208 provided over the channel formation region 216, and the gate electrode 210 provided over the gate insulating film 208. Note that a transistor whose source electrode and drain electrode are not illustrated in a drawing may be referred to as a transistor for the sake of convenience. Further, in such a case, in description of a connection of a transistor, a source region and a source electrode are collectively referred to as a "source electrode," and a drain region and a drain electrode are collectively referred to as a "drain electrode". That is, in this specification, the term "source electrode" may include a source region.

An element isolation insulating film 206 is provided over the substrate 200 so as to surround the transistor 260, and an insulating film 228 and an insulating film 230 are provided to cover the transistor 260. Note that for high integration, it is preferable that, as illustrated in FIG. 6A, the transistor 260 does not have a sidewall insulating film. On the other hand, when the characteristics of the transistor 260 have priority, the sidewall insulating film may be formed on a side surface of the gate electrode 210 and the impurity regions 220 may include a region having different impurity concentrations.

The transistor 260 formed using a single crystal semiconductor substrate can operate at high speed. Thus, when the transistor is used as a reading transistor, data can be read at a high speed. Two insulating films are formed so as to cover the transistor 260. As treatment prior to formation of the transistor 150 and a capacitor 264, CMP treatment is performed on the two insulating films, whereby an insulating film 228 and an insulating film 230 which are planarized are formed and, at the same time, an upper surface of the gate electrode 210 is exposed.

As each of the insulating film 228 and the insulating film 230, typically, it is possible to use an inorganic insulating film such as a silicon oxide film, a silicon oxynitride film, an aluminum oxide film, an aluminum oxynitride film, a silicon nitride film, an aluminum nitride film, a silicon nitride oxide film, or an aluminum nitride oxide film. The insulating film 228 and the insulating film 230 can be formed by a plasma CVD method, a sputtering method, or the like.

As the planarization insulating film, an organic material such as a polyimide-based resin, an acrylic-based resin, or a benzocyclobutene-based resin can be used. Other than such organic materials, it is also possible to use a low-dielectric constant material (a low-k material) or the like. In the case of using an organic material, the insulating film 228 and the insulating film 230 may be formed by a wet method such as a spin coating method or a printing method.

Note that in this embodiment, a silicon nitride film is used as the insulating film 228, and a silicon oxide film is used as the insulating film 230.

An oxide semiconductor film 106 is formed over the insulating film 230 which is sufficiently planarized by polishing treatment (such as CMP treatment). Note that the average plane roughness of a surface of the insulating film 230 is preferably less than or equal to 0.15 nm.

The transistor 150 illustrated in FIG. 6A uses an oxide semiconductor in the channel formation region. Here, the oxide semiconductor film 106 included in the transistor 150 is preferably highly purified. With use of a highly purified oxide semiconductor, the transistor 150 which has extremely favorable off-state characteristics can be obtained.

Since the off-state current of the transistor 150 is small, stored data can be held for a long time owing to such a transistor. In other words, power consumption can be sufficiently reduced because a semiconductor memory device in which refresh operation is unnecessary or the frequency of refresh operation is extremely low can be provided.

An insulating film 180 having a single-layer structure or a stacked structure is provided over the transistor 150. In this embodiment, the insulating film 180 has a stacked structure in which an aluminum oxide film and a silicon oxide film are stacked in this order on a gate electrode 112 side. Note that when the aluminum oxide film has high density (e.g., a film density higher than or equal to 3.2 $g/cm^3$, preferably higher than or equal to 3.6 $g/cm^3$), the transistor 150 can have stable electric characteristics.

Further, a conductive film 182 is provided in a region which overlaps with the source electrode 108a of the transistor 150 with the gate insulating film 110 and the insulating film 180 interposed therebetween. A capacitor 264 is formed with the source electrode 108a, the gate insulating film 110, the insulating film 180, and the conductive film 182. That is, the source electrode 108a of the transistor 150 functions as one electrode of the capacitor 264, and the conductive film 182 functions as the other electrode of the capacitor 264. Note that in the case where a capacitor is not needed, the capacitor 264 may be omitted. Alternatively, the capacitor 264 may be separately provided above the transistor 150.

An insulating film 184 is provided over the transistor 150 and the capacitor 264. In addition, a wiring 186 for connecting the transistor 150 to another transistor is provided over the insulating film 184. Although not illustrated in FIG. 6A, the wiring 186 is electrically connected to the drain electrode 108b with an electrode formed in an opening that is formed in the insulating film 180, the gate insulating film 110, and the like. Here, the electrode is preferably provided so as to partly overlap with at least the oxide semiconductor film 106 of the transistor 150.

In FIGS. 6A and 6B, the transistor 260 and 150 are provided so as to at least partly overlap with each other, and the source region or the drain region of the transistor 260 is preferably provided to partly overlap with the oxide semiconductor film 106. Further, the transistor 150 and the capacitor 264 are provided so as to overlap with at least part of the transistor 260. For example, the conductive film 182 of the capacitor 264 is provided so as to at least partly overlap with the gate electrode 210 of the transistor 260. With such a planar layout, the area occupied by the semiconductor device can be reduced; thus, higher integration can be achieved.

Note that the electrical connection between the drain electrode 108b and the wiring 186 may be established by direct contact of the drain electrode 108b and the wiring 186 with each other or through an electrode provided in an insulating layer lying therebetween. Alternatively, the electrical connection may be established through a plurality of electrodes.

Next, an example of a circuit configuration corresponding to FIGS. 6A and 6B is shown in FIG. 6C.

In FIG. 6C, a first wiring (1st Line) is electrically connected to one of the source electrode and the drain electrode of the transistor 260, and a second wiring (2nd Line) is electrically connected to the other of the source electrode and the drain electrode of the transistor 260. A third wiring (3rd line) and one of the source electrode and the drain electrode of the transistor 150 are electrically connected to each other, and a fourth wiring (4th line) and the gate electrode of the transistor 150 are electrically connected to each other. A gate electrode of the transistor 260 and the other of the source electrode and the drain electrode of the transistor 150 are electrically connected to one electrode of the capacitor 264. A fifth wiring (5th Line) and the other electrode of the capacitor 264 are electrically connected to each other.

The semiconductor device in FIG. 6C can write, hold, and read data as described below, utilizing a characteristic in which the potential of the gate electrode of the transistor 260 can be held.

Writing and holding of data will be described. First, the potential of the fourth wiring is set to a potential at which the transistor 150 is turned on, so that the transistor 150 is turned on. Thus, the potential of the third wiring is applied to the gate electrode of the transistor 260 and the capacitor 264. In other words, a predetermined charge is supplied to the gate electrode of the transistor 260 (i.e., writing of data). Here, charge for supply of a potential level or charge for supply of a different potential level (hereinafter referred to as Low level charge and High level charge) is given. After that, the potential of the fourth wiring is set to a potential at which the transistor 150 is turned off, so that the transistor 150 is turned off. Thus, the charge given to the gate electrode of the transistor 260 is held (holding).

Since the amount of off-state current of the transistor 150 is significantly small, the charge of the gate electrode of the transistor 260 is held for a long time.

Next, reading of data is described. By supplying an appropriate potential (reading potential) to the fifth wiring while a predetermined potential (constant potential) is supplied to the first wiring, the potential of the second wiring fluctuates depending on the amount of charge retained in the gate electrode of the transistor 260. This is because in general, when the transistor 260 is an n-channel transistor, an apparent threshold voltage $V_{th\_H}$ in the case where High level charge is given to the gate electrode of the transistor 260 is lower than an apparent threshold voltage $V_{th\_L}$ in the case where Low level charge is given to the gate electrode of the transistor 260. Here, an apparent threshold voltage refers to the potential of the fifth wiring, which is needed to turn on the transistor 260. Thus, the potential of the fifth wiring is set to a potential $V_0$ existing between $V_{th\_H}$ and $V_{th\_L}$, whereby charge given to the gate electrode of the transistor 260 can be determined. For example, in the case where High level charge is given in writing, when the potential of the fifth wiring is set to $V_0$ ($>V_{th\_H}$), the transistor 260 is turned on. In the case where a low level charge is given in writing, even when the potential of the fifth wiring is set to $V_0$ ($<V_{th\_L}$), the transistor 260 remains in an off state. Therefore, the stored data can be read by the potential of the second line.

Note that in the case where memory cells are arrayed to be used, only data of desired memory cells needs to be read. In the case where data is not read out, a potential at which the transistor 260 is turned off regardless of the state of the gate electrode, that is, a potential lower than $V_{th\_H}$ may be supplied to the fifth wiring. Alternatively, a potential at which the transistor 260 is turned on, that is, a potential higher than $V_{th\_L}$ may be given to the fifth wiring regardless of the state of the gate electrode of the transistor 260.

When a transistor having a channel formation region formed using an oxide semiconductor and having an extremely small amount of off-state current is applied to the semiconductor device in this embodiment, the semiconductor device can store data for an extremely long period. In other words, power consumption can be adequately reduced because refresh operation becomes unnecessary or the frequency of refresh operation can be extremely low. Moreover, stored data can be held for a long period even when power is not supplied (note that a potential is preferably fixed).

Further, in the semiconductor device described in this embodiment, high voltage is not needed for writing data and there is no problem of deterioration of elements. For example, unlike a conventional non-volatile memory, it is not necessary to inject and extract electrons into and from a floating gate, and thus a problem of deterioration of a gate insulating layer does not occur at all. In other words, the semiconductor device according to one embodiment of the present invention does not have a limit on the number of times of writing which is a problem in a conventional nonvolatile memory, and reliability thereof is drastically improved. Furthermore, data is written depending on the on state and the off state of the transistor, whereby high-speed operation can be easily realized.

Further, in the transistor 150, the concentration of impurities such as silicon entering the region 106a of the oxide semiconductor film 106 is reduced. In the case where the oxide semiconductor film 106 is a CAAC-OS film, a crystal portion can be formed even in the vicinity of the interface with the gate insulating film 110. As a result, the transistor 150 can have stable electric characteristics.

Therefore, a semiconductor device in which miniaturization and high integration are achieved and which have excellent electric characteristics can be provided.

The methods and structures described in this embodiment can be combined as appropriate with any of the methods and structures described in the other embodiments.

Embodiment 4

In this embodiment, a semiconductor device which includes the transistor described in Embodiment 1 or 2, which can hold stored data even when not powered, and which does not have a limitation on the number of write cycles, and which has a structure different from the structure described in Embodiment 3 will be described with reference to FIGS. 7A and 7B.

Figure 7A:
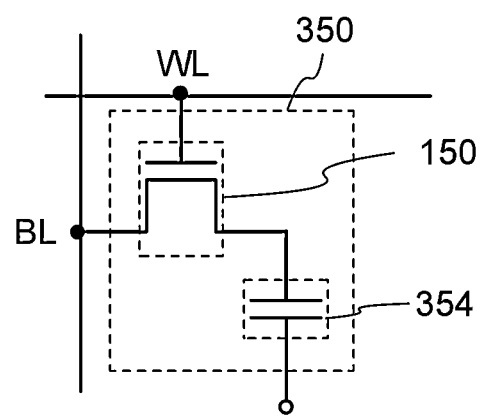
FIGS. 7A and 7B illustrate one embodiment of a semiconductor device.
Figure 7B:
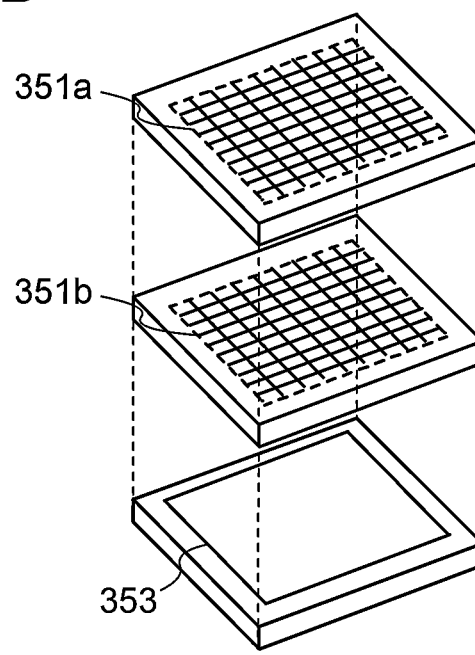

FIG. 7A is an example of a circuit configuration of a semiconductor device, and FIG. 7B is a conceptual diagram illustrating an example of a semiconductor device. First, the semiconductor device illustrated in FIG. 7A will be described, and then, the semiconductor device illustrated in FIG. 7B will be described.

In the semiconductor device illustrated in FIG. 7A, a bit line BL is electrically connected to a source electrode or a drain electrode of the transistor 150, a word line WL is electrically connected to a gate electrode of the transistor 150, and the source electrode or the drain electrode of the transistor 150 is electrically connected to a first terminal of a capacitor 354.

Here, the off-state current of the transistor 150 using an oxide semiconductor is extremely small. For that reason, a potential of the first terminal of the capacitor 354 (or a charge accumulated in the capacitor 354) can be held for an extremely long period in the state where the transistor 150 is off.

Next, writing and holding of data in the semiconductor device (a memory cell 350) illustrated in FIG. 7A will be described.

First, the potential of the word line WL is set to a potential at which the transistor 150 is turned on, and the transistor 150 is turned on. Accordingly, the potential of the bit line BL is supplied to the first terminal of the capacitor 354 (writing). After that, the potential of the word line WL is set to a potential at which the transistor 150 is turned off, so that the transistor 150 is turned off. Thus, the potential of the first terminal of the capacitor 354 is held (holding).

Because the off-state current of the transistor 150 is extremely small, the potential of the first terminal of the capacitor 354 (or the charge accumulated in the capacitor) can be held for a long time.

Next, reading of data will be described. When the transistor 150 is turned on, the bit line BL which is in a floating state and the capacitor 354 are electrically connected to each other, and the charge is redistributed between the bit line BL and the capacitor 354. As a result, the potential of the bit line BL is changed. The amount of change in potential of the bit line BL fluctuates depending on the potential of the first terminal of the capacitor 354 (or the charge accumulated in the capacitor 354).

For example, the potential of the bit line BL after charge redistribution is $(C_B \times V_{B0} + C \times V)/(C_B + C)$, where V is the potential of the first terminal of the capacitor 354, C is the capacitance of the capacitor 354, $C_B$ is the capacitance of the bit line BL (hereinafter also referred to as bit line capacitance), and $V_{B0}$ is the potential of the bit line BL before the charge redistribution. Therefore, it can be found that assuming that the memory cell 350 is in either of two states in which the potentials of the first terminal of the capacitor 354 are $V_1$ and $V_0$ ($V_1 > V_0$), the potential of the bit line BL in the case of holding the potential $V_1$ ($=(C_B \times V_{B0} + C \times V_1)/(C_B + C)$) is higher than the potential of the bit line BL in the case of holding the potential $V_0$ ($=(C_B \times V_{B0} + C \times V_0)/(C_B + C)$).

Then, by comparing the potential of the bit line BL with a predetermined potential, data can be read.

As described above, the semiconductor device illustrated in FIG. 7A can hold charge that is accumulated in the capacitor 354 for a long time because the off-state current of the transistor 150 is extremely small. In other words, power consumption can be adequately reduced because refresh operation becomes unnecessary or the frequency of refresh operation can be extremely low. Moreover, stored data can be held for a long time even when power is not supplied.

Next, the semiconductor device illustrated in FIG. 7B is described.

The semiconductor device illustrated in FIG. 7B includes memory cell arrays 351a and 351b including a plurality of memory cells 350 illustrated in FIG. 7A as a memory circuit in an upper portion, and a peripheral circuit 353 in a lower portion which is necessary for operation of the memory cell array 351 (the memory cell arrays 351a and 351b). Note that the peripheral circuit 353 is electrically connected to the memory cell array 351.

In the structure illustrated in FIG. 7B, the peripheral circuit 353 can be provided directly below the memory cell array 351 (the memory cell arrays 351a and 351b). Thus, the size of the semiconductor device can be decreased.

It is preferable that a semiconductor material of a transistor provided in the peripheral circuit 353 be different from that of the transistor 150. For example, silicon, germanium, silicon germanium, silicon carbide, gallium arsenide, or the like can be used, and a single crystal semiconductor is preferably used. Alternatively, an organic semiconductor material or the like may be used. A transistor including such a semiconductor material can operate at sufficiently high speed. Therefore, a variety of circuits (e.g., a logic circuit or a driver circuit) which needs to operate at high speed can be favorably realized by the transistor.

Note that FIG. 7B illustrates, as an example, the semiconductor device in which two memory cell arrays 351 (the memory cell arrays 351a and 351b) are stacked; however, the number of memory cell arrays to be stacked is not limited thereto. Three or more memory cell arrays may be stacked.

A semiconductor device having a novel feature can be obtained by being provided with both a peripheral circuit including the transistor including a material other than an oxide semiconductor (in other words, a transistor capable of operating at sufficiently high speed) and a memory circuit including the transistor including an oxide semiconductor (in a broader sense, a transistor whose off-state current is sufficiently small). In addition, with a structure where the peripheral circuit and the memory circuit are stacked, the degree of integration of the semiconductor device can be increased.

This embodiment can be implemented in appropriate combination with the structures described in the other embodiments.

Embodiment 5

In this embodiment, examples of application of the semiconductor device described in any of the above embodiments to portable devices such as mobile phones, smartphones, or electronic books will be described with reference to FIGS. 8A and 8B, FIG. 9, FIG. 10, and FIG. 11.

In portable electronic devices such as a mobile phone, a smart phone, and an e-book reader, an SRAM or a DRAM is used so as to store image data temporarily. This is because response speed of a flash memory is low and thus a flash memory is not suitable for image processing. On the other hand, an SRAM or a DRAM has the following characteristics when used for temporary storage of image data.

Figure 8A:
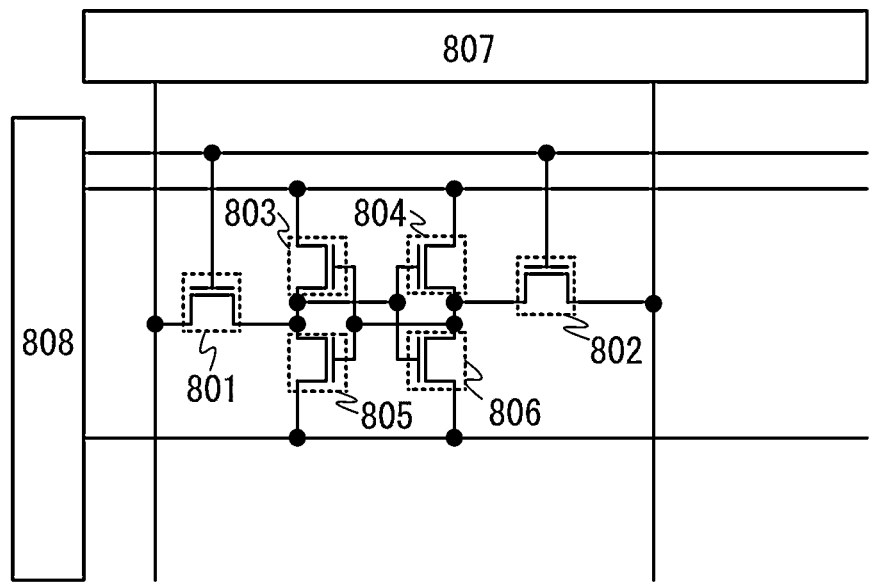
FIGS. 8A and 8B illustrate one embodiment of a semiconductor device.

In an ordinary SRAM, as shown in FIG. 8A, one memory cell includes six transistors, that is, transistors 801 to 806, which are driven with an X decoder 807 and a Y decoder 808. The transistors 803 and 805 and the transistors 804 and 806 each serve as an inverter, and high-speed driving can be performed therewith. However, an SRAM has a disadvantage of large cell area because one memory cell includes six transistors. Provided that the minimum feature size of a design rule is F, the area of a memory cell in an SRAM is generally 100 $F^2$ to 150 $F^2$. Therefore, a price per bit of an SRAM is the most expensive among a variety of memory devices.

Figure 8B:
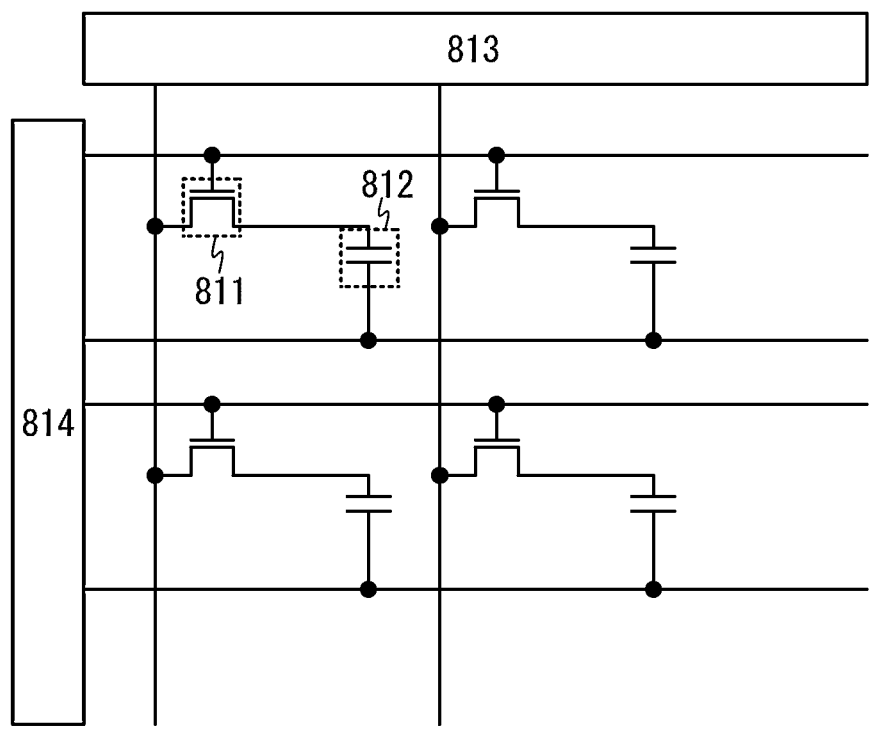

In a DRAM, as shown in FIG. 8B, a memory cell includes a transistor 811 and a storage capacitor 812, which are driven with an X decoder 813 and a Y decoder 814. One cell includes one transistor and one capacitor and thus the area of a memory cell is small. The area of a memory cell of a DRAM is generally less than or equal to 10 $F^2$. Note that in the case of a DRAM, a refresh operation is always necessary and power is consumed even when a rewriting operation is not performed.

However, the area of the memory cell of the semiconductor device described in the above embodiments is about 10 $F^2$ and frequent refreshing is not needed. Therefore, the area of the memory cell is reduced, and the power consumption can be reduced.

Figure 9:
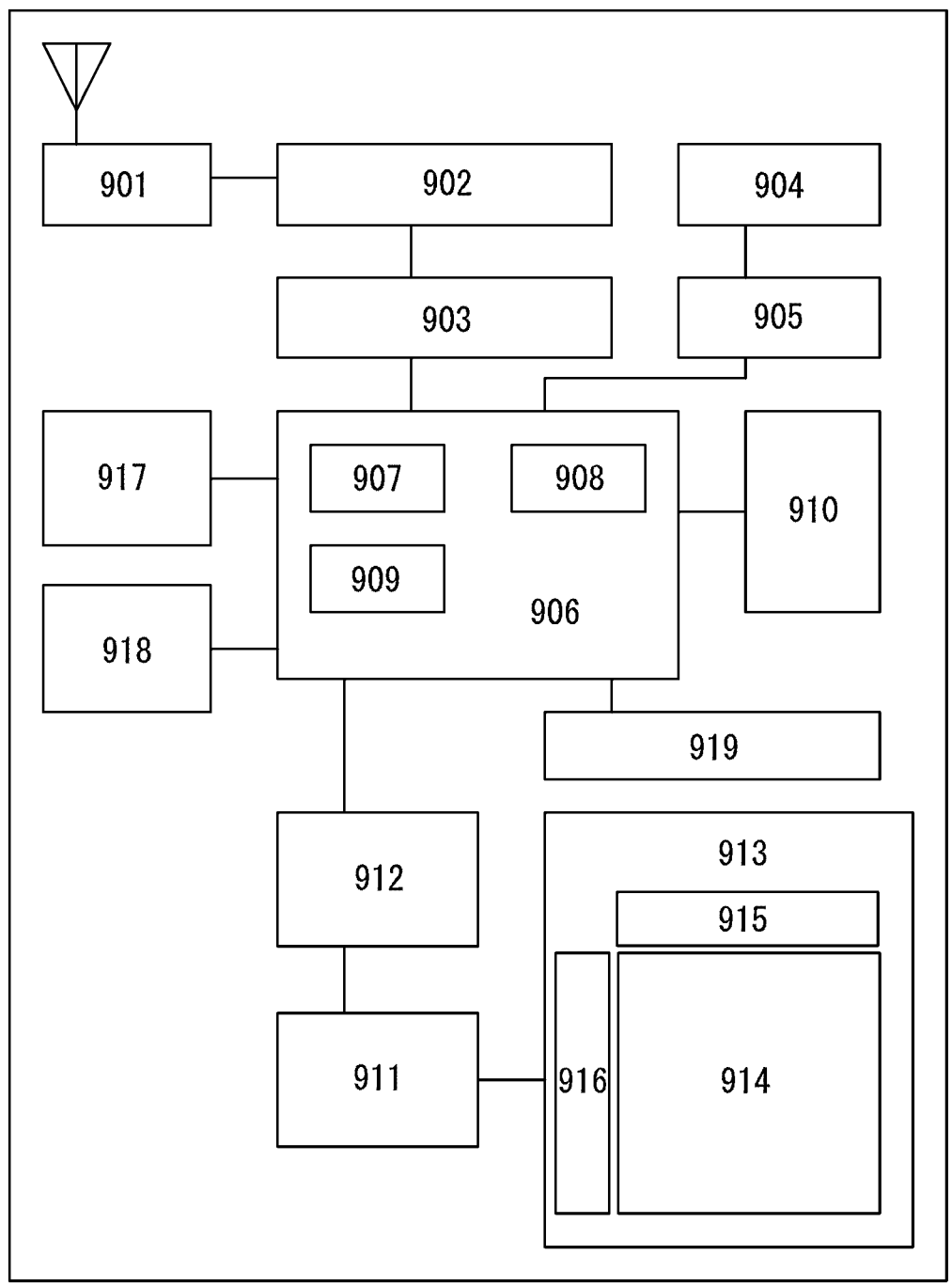
FIG. 9 illustrates one embodiment of a semiconductor device.

Next, FIG. 9 is a block diagram of a portable device. The portable device illustrated in FIG. 9 includes an RF circuit 901, an analog baseband circuit 902, a digital baseband circuit 903, a battery 904, a power supply circuit 905, an application processor 906, a flash memory 910, a display controller 911, a memory circuit 912, a display 913, a touch sensor 919, an audio circuit 917, a keyboard 918, and the like. The display 913 includes a display portion 914, a source driver 915, and a gate driver 916. The application processor 906 includes a CPU 907, a DSP 908, and an interface 909 (IF 909). In general, the memory circuit 912 includes an SRAM or a DRAM; by employing the semiconductor device described in any of the above embodiments for the memory circuit 912, writing and reading of data can be performed at high speed, data can be held for a long time, and power consumption can be sufficiently reduced.

Figure 10:
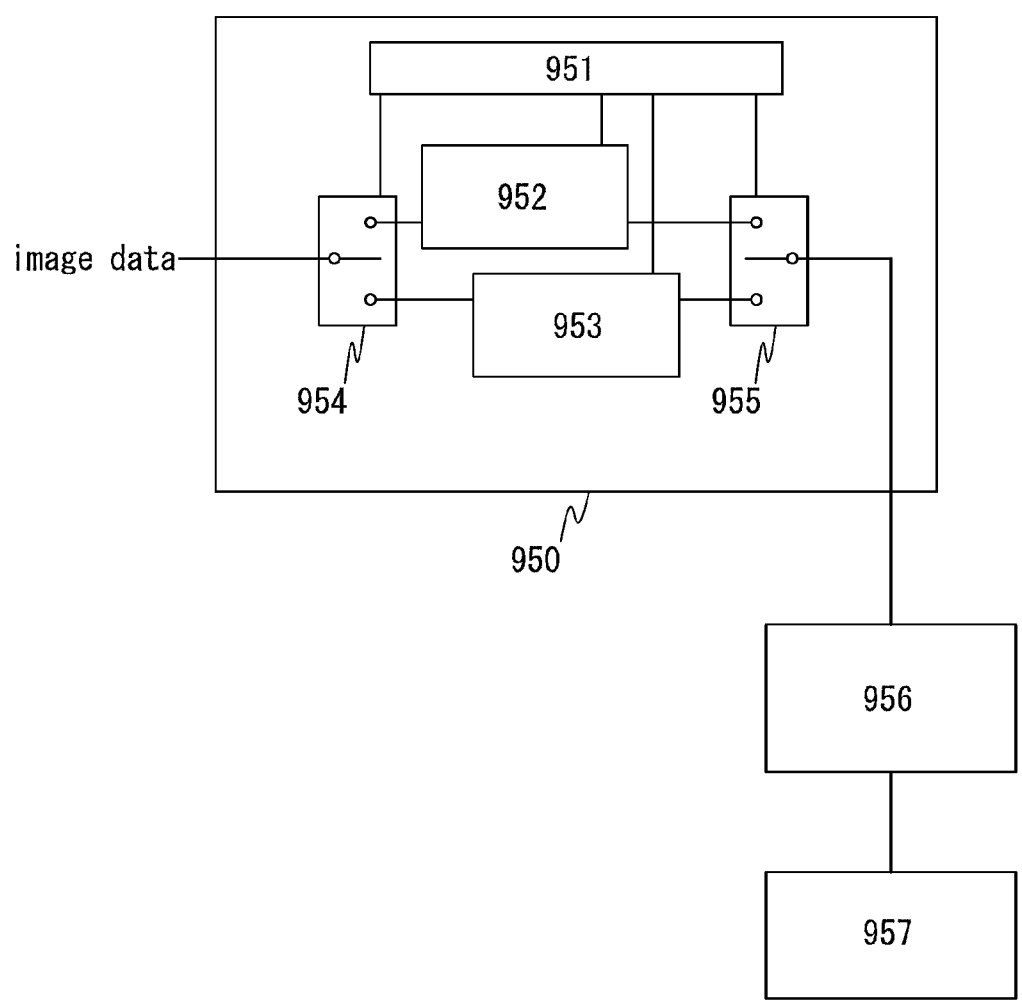
FIG. 10 illustrates one embodiment of a semiconductor device.

FIG. 10 illustrates an example of using the semiconductor device described in any of the above embodiments in a memory circuit 950 for a display. The memory circuit 950 illustrated in FIG. 10 includes a memory 952, a memory 953, a switch 954, a switch 955, and a memory controller 951. Further, the memory circuit is connected to a display controller 956 which reads and controls image data (input image data) input through a signal line and data stored in the memories 952 and 953 (stored image data), and is also connected to a display 957 which displays an image based on a signal from the display controller 956.

First, image data (input image data A) is formed by an application processor (not shown). The input image data A is held in the memory 952 though the switch 954. The image data (stored image data A) held in the memory 952 is transmitted to the display 957 through the switch 955 and the display controller 956 and displayed.

In the case where the input image data A is not changed, the stored image data A is read from the memory 952 through the switch 955 by the display controller 956 normally with a frequency of 30 Hz to 60 Hz.

Next, for example, when data displayed on the screen is rewritten by a user (that is, in the case where the input image data A is changed), new image data (input image data B) is formed by the application processor. The input image data B is held in the memory 953 through the switch 954. The stored image data A is read periodically from the memory 952 through the switch 955 even during that time. After the completion of storing the new image data (the stored image data B) in the memory 953, from the next frame for the display 957, the stored image data B starts to be read, transmitted to the display 957 through the switch 955 and the display controller 956, and displayed on the display 957. This reading operation is continued until another new image data is held in the memory 952.

Accordingly, image data is alternately written and read in the memories 952 and 953, so that the image data is displayed on the display 957. The memories 952 and 953 are not necessarily different memories, and a memory region included in one memory may be divided to be used. By employing the semiconductor device described in any of the above embodiments for the memory 952 and the memory 953, data can be written and read at high speed and held for a long time, and power consumption can be sufficiently reduced.

Figure 11:
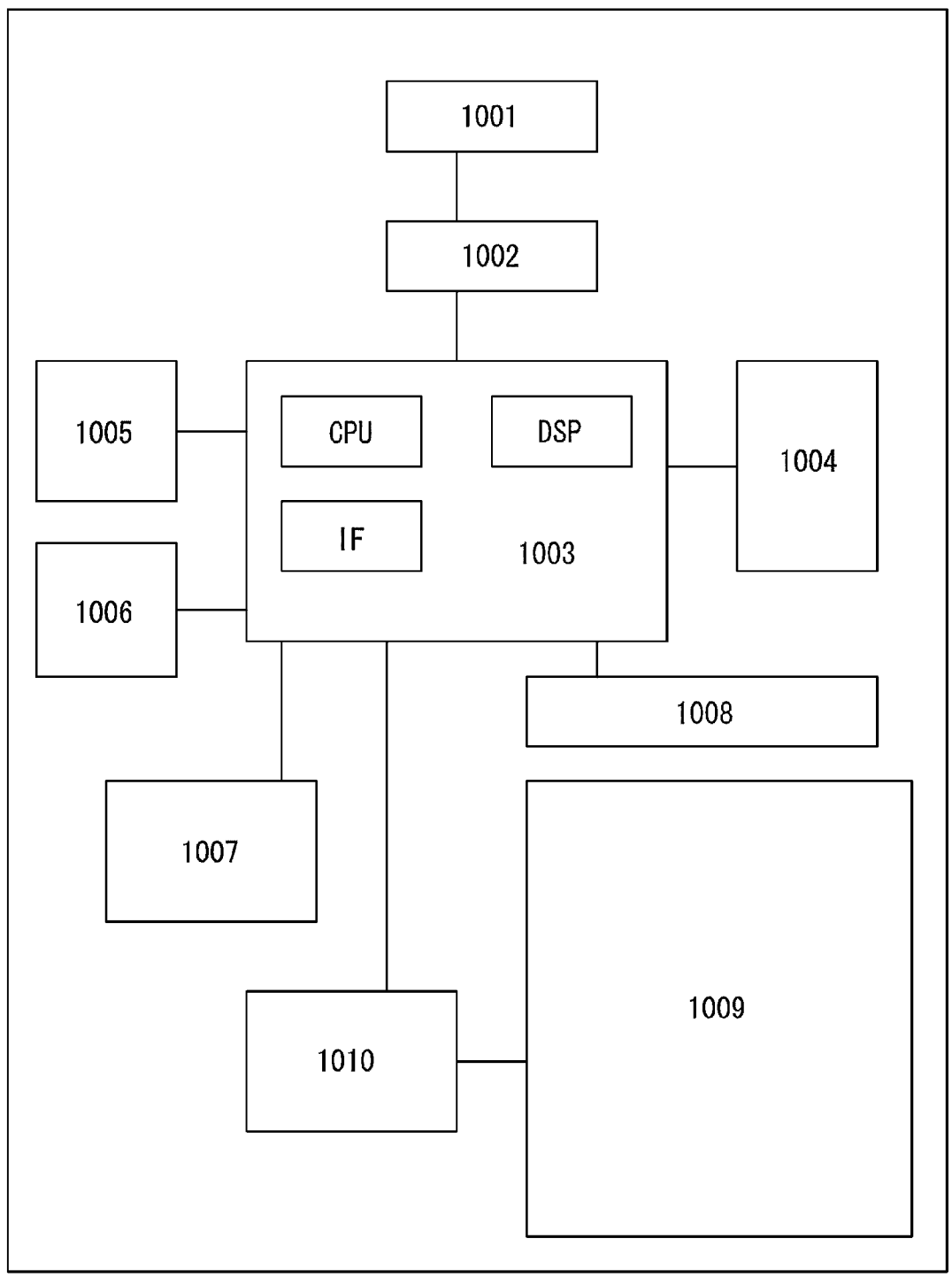
FIG. 11 illustrates one embodiment of a semiconductor device.

FIG. 11 is a block diagram of an e-book reader. FIG. 11 includes a battery 1001, a power supply circuit 1002, a microprocessor 1003, a flash memory 1004, an audio circuit 1005, a keyboard 1006, a memory circuit 1007, a touch panel 1008, a display 1009, and a display controller 1010.

Here, the semiconductor device described in any of the above embodiments can be used for the memory circuit 1007 in FIG. 11. The memory circuit 1007 has a function of temporarily storing the contents of a book. For example, users use a highlight function in some cases. When users read an e-book reader, they sometimes want to mark a specified place. This marking refers to a highlight function, and users can make difference from other places by, for example, changing the color of a letter displayed, underlining a word, making a letter bold, or changing the font type of a letter. That is, this is a function of storing and holding data of a place specified by users. In order to save data for a long time, the data may be copied into the flash memory 1004. Even in such a case, by employing the semiconductor device described in any of the above embodiments, writing and reading of data can be performed at high speed, data can be held for a long time, and power consumption can be sufficiently reduced.

As described above, the semiconductor device in any of the above embodiments is mounted on each of the portable devices described in this embodiment. Therefore, a portable device in which writing and reading of data are performed at high speed, data is held for a long time, and power consumption is sufficiently reduced, can be obtained.

The structures, methods, and the like described in this embodiment can be combined as appropriate with any of the other structures, methods, and the like described in the other embodiments.

EXAMPLE

In this example, the characteristics of an oxide semiconductor film to which silicon (Si) was intentionally added were evaluated. The evaluation method will be described in detail below.

First, the oxide semiconductor film was formed with a sputtering apparatus. Thus, Si was intentionally added to a metal oxide target used for sputtering. As a metal oxide target, a target in which $SiO_2$ was added to an In—Ga—Zn-based oxide (hereinafter, IGZO) was formed. In other words, an In—Ga—Zn—Si-based oxide target was formed.

In this example, three IGZO targets were formed: Target A in which $SiO_2$ was added at 2 wt. % to a target with a composition ratio where In:Ga:Zn=1:1:1 [atomic ratio]; Target B in which $SiO_2$ was added at 5 wt. % to a target with a composition ratio where In:Ga:Zn=1:1:1 [atomic ratio]; and Target C (In:Ga:Zn=1:1:1 [atomic ratio]) to which $SiO_2$ was not added.

Note that in some cases, a thin film formed using Target A is referred to as IGZO—$SiO_x$ (2 wt. %), a thin film formed using Target B is referred to as IGZO—$SiO_x$ (5 wt. %), and a thin film formed using Target C is referred to as IGZO.

Next, thin oxide semiconductor films were formed using Target A, Target B, and Target C, and their characteristics were evaluated. For evaluation, sheet resistance, composition, and crystallinity of the obtained thin films were measured and analyzed.

(Sheet Resistance Measurement)

Samples 1 to 6 were manufactured. Sample 1 was formed in the following manner: an oxide semiconductor film was formed over a glass substrate with use of Target C by a sputtering method under conditions that power=100 W, pressure=0.4 Pa, substrate temperature=200° C., and $Ar/O_2$=10/5 sccm ($O_2$=33%); heat treatment at 450° C. was conducted on the oxide semiconductor film in a nitrogen atmosphere for one hour; and then heat treatment at 450° C. was conducted in an oxygen atmosphere for one hour. Sample 2 was formed in the following manner: an oxide semiconductor film was formed over a glass substrate with use of Target C by a sputtering method under conditions that power=100 W, pressure=0.4 Pa, substrate temperature=200° C., and Ar/O$_2$=0/15 sccm (O$_2$=100%); heat treatment at 450° C. was conducted on the oxide semiconductor film in a nitrogen atmosphere for one hour; and then heat treatment at 450° C. was conducted in an oxygen atmosphere for one hour. Sample 3 was formed in the following manner: an oxide semiconductor film was formed over a glass substrate with use of Target A by a sputtering method under conditions that power=100 W, pressure=0.4 Pa, substrate temperature=200° C., and Ar/O$_2$=10/5 sccm (O$_2$=33%); heat treatment at 450° C. was conducted on the oxide semiconductor film in a nitrogen atmosphere for one hour; and then heat treatment at 450° C. was conducted in an oxygen atmosphere for one hour. Sample 4 was formed in the following manner: an oxide semiconductor film was formed over a glass substrate with use of Target A by a sputtering method under conditions that power=100 W, pressure=0.4 Pa, substrate temperature=200° C., and Ar/O$_2$=0/15 sccm (O$_2$=100%); heat treatment at 450° C. was conducted on the oxide semiconductor film in a nitrogen atmosphere for one hour; and then heat treatment at 450° C. was conducted in an oxygen atmosphere for one hour. Sample 5 was formed in the following manner: an oxide semiconductor film was formed over a glass substrate with use of Target B by a sputtering method under conditions that power=100 W, pressure=0.4 Pa, substrate temperature=200° C., and Ar/O$_2$=10/5 sccm (O$_2$=33%); heat treatment at 450° C. was conducted on the oxide semiconductor film in a nitrogen atmosphere for one hour; and then heat treatment at 450° C. was conducted in an oxygen atmosphere for one hour. Sample 6 was formed in the following manner: an oxide semiconductor film was formed over a glass substrate with use of Target B by a sputtering method under conditions that power=100 W, pressure=0.4 Pa, substrate temperature=200° C., and Ar/O$_2$=0/15 sccm (O$_2$=100%); heat treatment at 450° C. was conducted on the oxide semiconductor film in a nitrogen atmosphere for one hour; and then heat treatment at 450° C. was conducted in an oxygen atmosphere for one hour.

Each thickness of the oxide semiconductor films in Samples 1 to 6 was 100 nm. The deposition conditions of manufactured samples, structures thereof, and the like are shown in Table 1.

TABLE 1

| | Target | Deposition Condition | Sample Structure | Heat Treatment |
|---|---|---|---|---|
| Sample 1 | Target C | Ar/O$_2$ = 10/5 sccm (O$_2$ = 33%) | Glass\IGZO = 100 nm | 450° C. |
| Sample 2 | Target C | Ar/O$_2$ = 0/15 sccm (O$_2$ = 100%) | Glass\IGZO = 100 nm | 450° C. |
| Sample 3 | Target A | Ar/O$_2$ = 10/5 sccm (O$_2$ = 33%) | Glass\IGZO-SiO$_x$ (2 wt %) = 100 nm | 450° C. |
| Sample 4 | Target A | Ar/O$_2$ = 0/15 sccm (O$_2$ = 100%) | Glass\IGZO-SiO$_x$ (2 wt %) = 100 nm | 450° C. |
| Sample 5 | Target B | Ar/O$_2$ = 10/5 sccm (O$_2$ = 33%) | Glass\IGZO-SiO$_x$ (5 wt %) = 100 nm | 450° C. |
| Sample 6 | Target B | Ar/O$_2$ = 0/15 sccm (O$_2$ = 100%) | Glass\IGZO-SiO$_x$ (5 wt %) = 100 nm | 450° C. |

Figure 17:
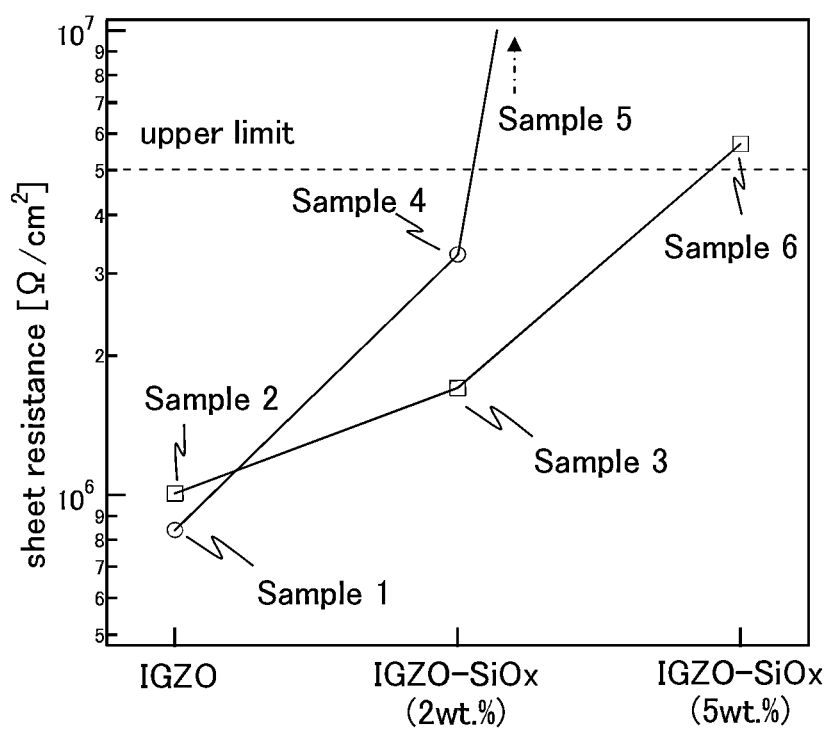
FIG. 17 shows measurement results according to Example of the present invention.

Next, sheet resistance of Samples 1 to 6 was measured. Note that for sheet resistance measurement, a sheet resistance measurement system was used. FIG. 17 shows measurement results of sheet resistance of Samples 1 to 6. In FIG. 17, the horizontal axis indicates objects (formed thin films), and the vertical axis indicates sheet resistance.

As can be seen from FIG. 17, sheet resistance of thin films is increased by adding Si to IGZO. In particular, the sheet resistance of Sample 5 exceeded the measurement upper limit ($5 \times 10^5$ Ω/cm$^2$) of the measurement system and thus it was impossible to measure the sheet resistance value. Note that although the sheet resistance of Sample 6 also exceeded the measurement upper limit of the measurement system, the value around the upper limit of the measurement system was calculated in principle. However, the value of the upper limit of the measurement system is not always measured accurately.

(Composition Analysis)

Samples 7 and 8 were manufactured. Sample 7 was formed in the following manner: an oxide semiconductor film was formed over a glass substrate with use of Target A by a sputtering method under conditions that power=100 W, pressure=0.4 Pa, substrate temperature=200° C., and Ar/O$_2$=0/15 sccm (O$_2$=100%). Sample 8 was formed in the following manner: an oxide semiconductor film was formed over a glass substrate with use of Target B by a sputtering method under conditions that power=100 W, pressure=0.4 Pa, substrate temperature=200° C., and Ar/O$_2$=0/15 sccm (O$_2$=100%).

Each thickness of the oxide semiconductor films in Samples 7 and 8 was 100 nm.

Next, composition analysis was performed on Samples 7 and 8. For composition analysis, X-ray photoelectron spectroscopy (XPS) was used. XPS is a measurement method by which photoelectron energy generated by irradiating a surface of sample with X-ray is measured, so that a constituent element of the sample and the electron state thereof can be analyzed. Table 2 shows deposition conditions, structures, and composition analysis of Samples 7 and 8.

TABLE 2

| | Target | Deposition Condition | Sample Structure | Composition Analysis Result [unit: at. %] | | | | |
|---|---|---|---|---|---|---|---|---|
| | | | | In | Ga | Zn | O | Si |
| Sample 7 | Target A | Ar/O$_2$ = 0/15 sccm (O$_2$ = 100%) | Glass\IGZO-SiO$_x$ (2 wt %) = 100 nm | 18.0 | 15.3 | 4.6 | 61.0 | 1.1 |
| Sample 8 | Target B | Ar/O$_2$ = 0/15 sccm (O$_2$ = 100%) | Glass\IGZO-SiO$_x$ (5 wt %) = 100 nm | 16.7 | 14.4 | 4.3 | 62.0 | 2.6 |

According to Table 2, Sample 7 formed with use of Target A has such composition that In=18.0 (at. %), Ga=15.3 (at. %), Zn=4.6 (at. %), O=61.0 (at. %), and Si=1.1 (at. %); Sample 8 formed with use of Target B has such composition that In=16.7 (at. %), Ga=14.4 (at. %), Zn=4.3 (at. %), O=62.0 (at. %), and Si=2.6 (at. %).

(Crystallinity Analysis)

Samples 9 to 14 were manufactured. Sample 9 was formed in the following manner: an oxide semiconductor film was formed over a glass substrate with use of Target A by a sputtering method under conditions that power=100 W, pressure=0.4 Pa, substrate temperature=200° C., and Ar/O$_2$=0/15 sccm (O$_2$=100%). Sample 10 was formed in the following manner: an oxide semiconductor film was formed over a glass substrate with use of Target A by a sputtering method under conditions that power=100 W, pressure=0.4 Pa, substrate temperature=200° C., and Ar/O$_2$=0/15 sccm (O$_2$=100%); heat treatment at 450° C. was conducted on the oxide semiconductor film in a nitrogen atmosphere for one hour; and then heat treatment at 450° C. was conducted in an oxygen atmosphere for one hour. Sample 11 was formed in the following manner: an oxide semiconductor film was formed over a glass substrate with use of Target A by a sputtering method under conditions that power=100 W, pressure=0.4 Pa, substrate temperature=200° C., and Ar/O$_2$=0/15 sccm (O$_2$=100%); heat treatment at 650° C. was conducted on the oxide semiconductor film in a nitrogen atmosphere for one hour; and then heat treatment at 650° C. was conducted in an oxygen atmosphere for one hour. Sample 12 was formed in the following manner: an oxide semiconductor film was formed over a glass substrate with use of Target B by a sputtering method under conditions that power=100 W, pressure=0.4 Pa, substrate temperature=200° C., and Ar/O$_2$=0/15 sccm (O$_2$=100%). Sample 13 was formed in the following manner: an oxide semiconductor film was formed over a glass substrate with use of Target B by a sputtering method under conditions that power=100 W, pressure=0.4 Pa, substrate temperature=200° C., and Ar/O$_2$=0/15 sccm (O$_2$=100%); heat treatment at 450° C. was conducted on the oxide semiconductor film in a nitrogen atmosphere for one hour; and then heat treatment at 450° C. was conducted in an oxygen atmosphere for one hour. Sample 14 was formed in the following manner: an oxide semiconductor film was formed over a glass substrate with use of Target B by a sputtering method under conditions that power=100 W, pressure=0.4 Pa, substrate temperature=200° C., and Ar/O$_2$=0/15 sccm (O$_2$=100%); heat treatment at 650° C. was conducted on the oxide semiconductor film in a nitrogen atmosphere for one hour; and then heat treatment at 650° C. was conducted in an oxygen atmosphere for one hour.

Each thickness of the oxide semiconductor films in Samples 9 to 14 was 100 nm. Table 3 shows deposition conditions of the manufactured samples, structures thereof, and the like. Note that Samples 9 to 11 are oxide semiconductor films each of which has composition similar to that of Sample 7, and Samples 12 to 14 are oxide semiconductor films each of which has composition similar to that of Sample 8.

TABLE 3

| | Target | Deposition Condition | Sample Structure | Heat Treatment |
|---|---|---|---|---|
| Sample 9 | Target A | Ar/O$_2$ = 0/15 sccm (O$_2$ = 100%) | Glass\IGZO-SiO$_x$ (2 wt %) = 100 nm | No |
| Sample 10 | Target A | Ar/O$_2$ = 0/15 sccm (O$_2$ = 100%) | Glass\IGZO-SiO$_x$ (2 wt %) = 100 nm | 450° C. |
| Sample 11 | Target A | Ar/O$_2$ = 0/15 sccm (O$_2$ = 100%) | Glass\IGZO-SiO$_x$ (2 wt %) = 100 nm | 650° C. |

TABLE 3-continued

| | Target | Deposition Condition | Sample Structure | Heat Treatment |
|---|---|---|---|---|
| Sample 12 | Target B | Ar/O$_2$ = 0/15 sccm (O$_2$ = 100%) | Glass\IGZO-SiO$_x$ (5 wt %) = 100 nm | No |
| Sample 13 | Target B | Ar/O$_2$ = 0/15 sccm (O$_2$ = 100%) | Glass\IGZO-SiO$_x$ (5 wt %) = 100 nm | 450° C. |
| Sample 14 | Target B | Ar/O$_2$ = 0/15 sccm (O$_2$ = 100%) | Glass\IGZO-SiO$_x$ (5 wt %) = 100 nm | 650° C. |

Figure 18A:
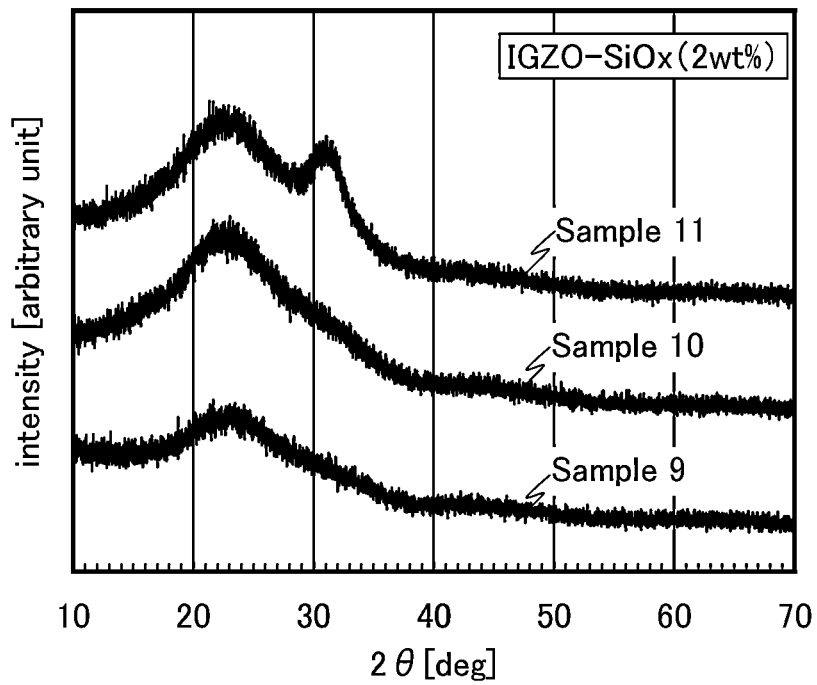
FIGS. 18A and 18B show measurement results according to Example of the present invention.

Next, crystallinity of Samples 9 to 14 was analyzed. For analysis of crystallinity, X-ray diffraction (XRD) was used. XRD is a phenomenon in which a X-ray is diffracted at a crystal lattice, so that crystallinity of samples for measurement can be measured. FIG. 18A shows crystallinity analysis results of Samples 9 to 11, and FIG. 18B shows crystallinity analysis results of Samples 12 to 14.

As can be seen from FIG. 18A showing analysis results of Samples 9 to 11 formed with use of Target A, Sample 9 on which heat treatment was not performed and Sample 10 on which heat treatment at 450° C. was performed have no diffraction peak showing definite crystallinity. On the other hand, in the case of Sample 11 on which heat treatment at 650° C. was performed, a diffraction peak showing crystallinity is observed around at 2θ=31°.

Figure 18B:
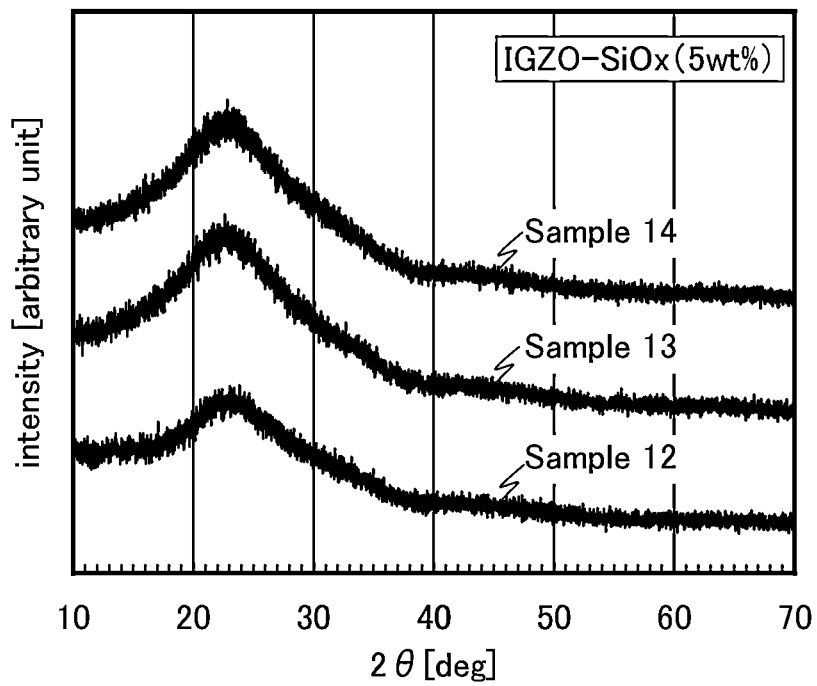

Further, as can be seen from FIG. 18B showing analysis results of Samples 12 to 14 formed with use of Target B, a diffraction peak showing definite crystallinity is not observed in any of Sample 12 on which heat treatment was not performed, Sample 13 on which heat treatment at 450° C. was performed, and Sample 14 on which heat treatment at 650° C. was performed.

According to the above results, in each of Samples 9 to 11 formed with use of Target A, the concentration of silicon (Si) in the oxide semiconductor film is 1.1 at. %; in each of Samples 12 to 14 formed with use of Target B, the concentration of silicon (Si) in the oxide semiconductor film is 2.6 at. %. As a result, it is found that crystallinity of the oxide semiconductor film is inhibited when the concentration of Si in the oxide semiconductor film is high.

EXPLANATION OF REFERENCE

102: substrate, 104: base insulating film, 106: oxide semiconductor film, 106a: region, 106b: region, 106c: region, 106d: region, 106e: region, 106f: region, 106g: region, 106h: region, 108a: source electrode, 108b: drain electrode, 110: gate insulating film, 112: gate electrode, 113: oxide semiconductor film, 114: interlayer insulating film, 150: transistor, 160: transistor, 180: insulating film, 181: dopant, 182: conductive film, 184: insulating film, 186: wiring, 200: substrate, 206: element isolation insulating film, 208: gate insulating film, 210: gate electrode, 216: channel formation region, 220: impurity region, 224: intermetallic compound region, 228: insulating film, 230: insulating film, 254: capacitor, 260: transistor, 264: capacitor, 350: memory cell, 351: memory cell array, 351a: memory cell array, 351b: memory cell array, 353: peripheral circuit, 354: capacitor, 801: transistor, 803: transistor, 804: transistor, 805: transistor, 806: transistor, 807: X decoder, 808: Y decoder, 811: transistor, 812: storage capacitor, 813: X decoder, 814: Y decoder, 901: RF circuit, 902: analog baseband circuit, 903: digital baseband circuit, 904: battery, 905: power supply circuit, 906: application processor, 907: CPU, 908: DSP, 909: interface, 910: flash memory, 911: display controller, 912: memory circuit, 913: display, 914: display portion, 915: source driver, 916: gate driver, 917: audio circuit, 918: keyboard, 919: touch sensor, 950: memory circuit, 951: memory controller, 952: memory, 953: memory, 954: switch, 955: switch, 956: display controller, 957: display, 1001: battery, 1002: power supply circuit, 1003: microprocessor, 1004: flash memory, 1005: audio circuit, 1006: keyboard, 1007: memory circuit, 1008: touch panel, 1009: display, 1010: display controller This application is based on Japanese Patent Application serial no. 2011-227022 filed with Japan Patent Office on Oct. 14, 2011, the entire contents of which are hereby incorporated by reference.

The invention claimed is:

1. A semiconductor device comprising:
an oxide semiconductor film over a substrate;
a source electrode and a drain electrode over the oxide semiconductor film;
a gate insulating film over the oxide semiconductor film, wherein the gate insulating film comprises an oxide containing silicon; and
a gate electrode over the gate insulating film,
wherein the oxide semiconductor film comprises:
a first region in which a concentration of silicon is lower than or equal to 1.0 at. %; and
a pair of second regions, each of the pair of second regions comprising a dopant,
wherein the first region is located at an interface between the oxide semiconductor film and the gate insulating film and in contact with the gate insulating film, and
wherein the first region comprises a crystal portion.

2. The semiconductor device according to claim 1, wherein an end portion of the oxide semiconductor film is tapered at an angle of 20° to 50°.

3. The semiconductor device according to claim 1, further comprising a base insulating film between the substrate and the oxide semiconductor film,
wherein in the crystal portion, a c-axis is aligned in a direction perpendicular to an interface between the base insulating film and the oxide semiconductor film.

4. The semiconductor device according to claim 1, wherein the concentration of silicon in the first region is lower than or equal to 0.1 at. %.

5. The semiconductor device according to claim 1, further comprising an interlayer insulating film over the gate insulating film and the gate electrode.

6. The semiconductor device according to claim 1, wherein a concentration of carbon in the first region is lower than or equal to $1.0 \times 10^{20}$ atoms/cm$^3$.

7. The semiconductor device according to claim 1, wherein the first region has a thickness less than or equal to 5 nm.

8. The semiconductor device according to claim 1, wherein the dopant comprises one or more elements selected from the group consisting of phosphorus, arsenic, antimony, boron, aluminum, nitrogen, argon, helium, neon, indium, fluorine, chlorine, titanium, and zinc.

9. The semiconductor device according to claim 1, wherein a concentration of dopant in each of the pair of second regions is higher than or equal to $5 \times 10^{18}$ atoms/cm$^3$ and lower than or equal to $1 \times 10^{22}$ atoms/cm$^3$.

10. The semiconductor device according to claim 1, wherein the pair of second regions and the gate electrode do not overlap each other.

11. A semiconductor device comprising:
an oxide semiconductor film over a substrate;
a source electrode and a drain electrode over the oxide semiconductor film;
a gate insulating film over the oxide semiconductor film, wherein the gate insulating film comprises an oxide containing silicon; and
a gate electrode over the gate insulating film,
wherein the oxide semiconductor film comprises:
a first region in which a concentration of silicon is lower than or equal to 1.0 at. %; and
a pair of second regions, each of the pair of second regions comprising a dopant,
wherein the first region is located at an interface between the oxide semiconductor film and the gate insulating film and in contact with the gate insulating film,
wherein the first region comprises a crystal portion, and
wherein the dopant comprises argon.

12. The semiconductor device according to claim 11, wherein an end portion of the oxide semiconductor film is tapered at an angle of 20° to 50°.

13. The semiconductor device according to claim 11, further comprising a base insulating film between the substrate and the oxide semiconductor film,
wherein in the crystal portion, a c-axis is aligned in a direction perpendicular to an interface between the base insulating film and the oxide semiconductor film.

14. The semiconductor device according to claim 11, wherein the concentration of silicon in the first region is lower than or equal to 0.1 at. %.

15. The semiconductor device according to claim 11, further comprising an interlayer insulating film over the gate insulating film and the gate electrode.

16. The semiconductor device according to claim 11, wherein a concentration of carbon in the first region is lower than or equal to $1.0 \times 10^{20}$ atoms/cm$^3$.

17. The semiconductor device according to claim 11, wherein the first region has a thickness less than or equal to 5 nm.

18. The semiconductor device according to claim 11, wherein the dopant comprises one or more elements selected from the group consisting of phosphorus, arsenic, antimony, boron, aluminum, nitrogen, argon, helium, neon, indium, fluorine, chlorine, titanium, and zinc.

19. The semiconductor device according to claim 11, wherein a concentration of dopant in each of the pair of second regions is higher than or equal to $5 \times 10^{18}$ atoms/cm$^3$ and lower than or equal to $1 \times 10^{22}$ atoms/cm$^3$.

20. The semiconductor device according to claim 11, wherein the pair of second regions and the gate electrode do not overlap each other.

* * * * *